(12) United States Patent
Hurst et al.

(10) Patent No.: US 6,646,912 B2
(45) Date of Patent: Nov. 11, 2003

(54) NON-VOLATILE MEMORY

(75) Inventors: Terril N. Hurst, Tucson, AZ (US);
Craig Perlov, San Mateo, CA (US);
Carol Wilson, San Jose, CA (US); Carl Taussig, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/875,356

(22) Filed: Jun. 5, 2001

(65) Prior Publication Data

US 2002/0196659 A1 Dec. 26, 2002

(51) Int. Cl.[7] .............................................. G11C 11/36
(52) U.S. Cl. ........................... 365/175; 365/63; 365/96; 365/225.7
(58) Field of Search .............................. 365/63, 72, 96, 365/225.7, 174, 175; 257/390, 529, 530

(56) References Cited

U.S. PATENT DOCUMENTS

| 3,611,319 | A | * | 10/1971 | Hyatt | 365/96 |
| 4,382,289 | A | * | 5/1983 | Saitoh | 365/96 |
| 4,398,248 | A | * | 8/1983 | Hsia et al. | 365/200 |
| 4,491,860 | A | * | 1/1985 | Lim | 365/96 |
| 4,499,557 | A | * | 2/1985 | Holmberg et al. | 365/174 |
| 4,722,822 | A | * | 2/1988 | Thai et al. | 365/96 |
| 4,922,319 | A | * | 5/1990 | Fukushima | 365/96 |
| 5,536,968 | A | * | 7/1996 | Crafts et al. | 257/529 |
| 5,841,699 | A | * | 11/1998 | Miyauchi | 365/185.33 |
| 6,178,132 | B1 | * | 1/2001 | Chen | 365/230.02 |
| 6,301,155 | B1 | * | 10/2001 | Fujiwara | 365/185.01 |
| 6,335,880 | B2 | * | 1/2002 | Kato et al. | 365/185.4 |

* cited by examiner

*Primary Examiner*—Tan T. Nguyen

(57) ABSTRACT

A data storage device is disclosed that comprises a cross-point memory array formed on a dielectric substrate material. The cross-point memory array comprises first and second sets of transverse electrodes separated by a storage layer including at least one semiconductor layer. The storage layer forms a non-volatile memory element at each crossing point of electrodes from the first and second sets. Each memory element can be switched between low and high impedance states, representing respective binary data states, by application of a write signal in the form of a predetermined current density through the memory element. Each memory element includes a diode junction formed in the storage layer, at least whilst in the low impedance state. A plurality of the data storage devices can be stacked and laminated into a memory module providing inexpensive high capacity data storage. Such a memory module can be employed in an archival data storage system in which the memory module provides a write-once data storage unit receivable in an appliance or interface card.

30 Claims, 17 Drawing Sheets

NON-VOLATILE MEMORY

FIELD OF THE INVENTION

The present invention relates to the field of digital memory circuits, and in particular to non-volatile memory circuits suitable for high-density, high-capacity, low cost data storage.

BACKGROUND OF THE INVENTION

Many consumer devices are now constructed to generate and/or utilize digital data in increasingly large quantities. Portable digital cameras for still and/or moving pictures, for example, generate large amounts of digital data representing images. Each digital image may require up to several megabytes (MB) of data storage, and such storage must be available in the camera. To provide for this type of data storage application, the storage memory should be relatively low in cost for sufficient capacities of around 10 MB to 1 gigabyte (GB). The storage memory should also be low in power consumption (e.g. <<1 Watt) and have relatively rugged physical characteristics to cope with the portable battery powered operating environment. For archival storage, data need only be written to the memory once. Preferably the memory should have a short access time (preferably less than one millisecond) and moderate transfer rate (e.g. 20 Mb/s). Preferably, also, the storage memory should be able to be packaged in an industry standard interface module, such as PCMCIA or Compact Flash card.

One form of storage currently used for application in portable devices such as digital cameras is Flash memory. This meets the desired mechanical robustness, power consumption, transfer, and access rate characteristics mentioned above. However, a major disadvantage is that Flash memory remains relatively expensive ($1.50-$2 per MB). Because of the price it is generally unreasonable to use Flash memory storage as an archive device, thus requiring data to be transferred from it to a secondary archival storage. Also, it becomes prohibitively expensive to include a large amount of Flash memory in an inexpensive digital camera or similar digital appliance (MP3 Player, PDA, etc.). This can make certain features unavailable in such applications, for example recording video on an inexpensive digital camera, and can impair the function of other features, for example limiting the number of pictures a digital camera can store or the number of songs which can be stored on an MP3 audio player.

Magnetic "hard disc" storage can also be used for archival storage, even in portable devices. Miniature hard disc drives are available for the PCMCIA type III form factor, offering capacities of up to 1 GB. However, such disc drives are still relatively expensive ($0.5 per MB), at least partially because of the relatively high fixed cost of the disc controller electronics. Miniature hard drives have other disadvantages when compared to Flash memory, such as lower mechanical robustness, higher power consumption (~2 to 4W), and relatively long access times (~10 mS). Hard drives also have disadvantages including rotational latency, and 'wake-up' time, which can be one second or more.

Removable optical storage discs can similarly be used, and offer one large advantage compared to hard disc. The removable optical media is very inexpensive, for example of the order of $0.03 per MB for Minidisc media. However in most other respects optical disc storage compares poorly with magnetic hard discs including relatively poor power consumption, mechanical robustness, bulk, and access performance.

Magnetic tape has even lower media cost than removable optical discs, however it shares other disadvantages of rotating disc storage, particularly with respect to physical bulk, and power consumption. In addition, magnetic tape has the disadvantage of serial access. This presents two additional application problems, namely very slow random access performance and restriction to uniform time compression techniques for storing video and the like.

For the specific application of photography, photographic film in the form of silver halide emulsions on plastic webs are a competing form of memory. The drawbacks of conventional film are its need for processing, limited shelf life, and physical bulk. The information storage on photographic film is inherently analogue in nature, and is quite unsuitable for directly interacting with digital processing apparatus and techniques. Furthermore, except in the case of Polaroid™ self developing photographic film, the stored information cannot be accessed immediately.

Embodiments of this invention address the problem of low cost archival storage for digital camera and other portable appliances. The requirements for this type of memory are: an industry standard interface (e.g. PCMCIA or Compact Flash), 2000 G shock tolerance, low power consumption (<<1W), short access time (<1 ms), moderate transfer rate (20 Mb/s), and sufficient capacity (10MB-1GB).

SUMMARY OF THE INVENTION

In accordance with the principles of the present invention, there is provided a data storage device comprising a cross-point memory array formed on a dielectric substrate material. The cross-point memory array comprises first and second sets of transverse electrodes separated by a storage layer including at least one semiconductor layer. The storage layer forms a non-volatile memory element at each crossing point of electrodes from the first and second sets. Each memory element can be switched between low and high impedance states, representing respective binary data states, by application of a write signal in the form of a predetermined current density through the memory element. Each memory element includes a diode junction formed in the storage layer, at least whilst in the low impedance state.

In one form of the invention the dielectric substrate is a formed from a polymeric material. In another form of the invention, the dielectric substrate is formed from a metal film, such as stainless steel, having a coating of dielectric material thereon.

The dielectric substrate may be formed, for example, from a material selected from: polyimide; polyethersulphone (PES); polyacrylate (PAR); polyetherimide (PEI); polyethylene napthalate (PEN); polyethylene terephthalate (PET); polyester terephthalate; polytetrafluoroethylene (PTFE); polycarbonate; and polyvinyl chloride (PVC);

The storage layer is preferably formed from material capable of processing at temperature lower than the processing temperature of the substrate material. In one form of the invention, the at least one semiconductor layer of the storage layer is formed from an organic semiconductor material. In embodiments of the invention, the organic semiconductor material may be selected from: copper pthalocyanine (CuPc); PTBCI (3,4,9,10-perylenetetracarbonxilic-bis-benzimidazole); PTCDA (3,4,9,10-perylenetetracarboxilic danhydride); BTQBT [(1,2,5-thiadiazolo)-p-quinobis(1,3-dithiole)]; TPD (N,N'-diphenyl-N,N'-bis(3-methylphenyl)1-1'biphenyl-4,4'-diamine); α-NPD (4,4'-bis[N-(1-napthyl)-N-phenyl-amino]biphenyl); and TPP (5,10,15,20-tetraphenyl-21H,23H-porphine).

In other embodiments of the invention, the at least one semiconductor layer of the storage layer is formed from an amorphous inorganic semiconductor material, such as amorphous silicon or germanium.

The data storage device preferably includes address decoding circuitry coupled to said first and second sets of memory array electrodes, the address decoding circuitry having first and second sets of input lines for addressing the first and second sets of electrodes, respectively. Preferably the first and second sets of input lines are coupled through diode elements to selected ones of the first and second sets of memory array electrodes, respectively.

The data storage device preferably also includes at least one data sense line having diode connections to each of the first and/or second set memory array electrodes.

In a preferred form of the invention the first and second sets of memory array electrodes are formed in separate layers separated by said storage layer, wherein the first and second sets of input lines are formed in the same layers as the second and first sets of electrodes, respectively.

In the preferred data storage device structure the first and second sets of input lines are arranged to cross the first and second sets of memory array electrodes, respectively, separated by said storage layer. The selected diode connections between respective input lines and electrodes are formed by said storage layer at the crossing points thereof.

In a preferred embodiment of the data storage device power supply striping circuitry is provided, coupled to said first and second sets of memory array electrodes. The power supply striping circuitry preferably comprises ends of the electrodes coupled through respective resistive elements and coupled together in groups to selective power supply stripe lines.

A particular preferred embodiment of the present invention comprises a memory module having a plurality of module layers each having a data storage device as recited above.

In one form of the invention the module layers are laminated together to form a block, and electrical contacts are provided on at least one external surface of the block for providing interconnection with the first and second sets of input lines, the at least one sense line and the power supply stripe lines of each module layer. Preferably corresponding input lines from each of the plurality of module layers are connected in parallel to address contacts for parallel addressing of the memory arrays in the memory module.

In accordance with the present invention there is also provided a memory module comprising a plurality of memory circuits formed in a unitary package, each memory circuit comprising a non-volatile cross-point memory array and an address decoding circuit fabricated on a common non-semiconductor substrate.

Each memory circuit is preferably formed from first and second layers of transverse conductor tracks separated by a storage layer including at least one semiconductor material layer. In a preferred embodiment, the memory array of each memory circuit comprises a matrix of memory elements, each memory element being formed by overlying portions of conductor tracks from the first and second layers at a crossing point thereof and a portion of said storage layer therebetween. The memory elements may be switched between low and high impedance states, representing respective binary data states, by application of a write signal in the form of a predetermined current density through the memory element. Each memory element includes a diode junction formed in the storage layer at least whilst in said low impedance state.

According to a preferred circuit structure, the address decoding circuit of each memory circuit comprises selected diode interconnections made through the storage layer between overlying portions of conductor tracks from the first and second layers at crossing points thereof.

A particularly preferred form of memory module is constructed from a plurality of module layers, each module layer having at least one of said plurality of memory circuits. The module layers may be laminated together to form a block, and electrical contacts provided on at least one external surface of the block for providing interconnection with conductor tracks of the memory circuits. In a preferred embodiment, inputs to the address decoding circuits of a plurality of the module layers are coupled together in parallel to the external electrical contacts.

The present invention also provides a digital data memory system comprising: a memory module having a plurality of non-volatile cross-point memory arrays formed in a unitary package; and an interface card adapted for interconnection with a data processing appliance. The interface card includes control circuitry for addressing, writing to and reading from the memory module, and a memory module interface adapted to receive a memory module and interconnect the control circuitry to the memory arrays thereof.

The memory module for use in the digital data memory system can be constructed as recited hereinabove, for example. The memory modules preferably provide permanent data storage, for example in the form of write-once non-volatile memory.

BRIEF DESCRIPTION OF THE DRAWINGS

The invention is described in greater detail hereinafter, by way of example only, through description of a preferred embodiment thereof and with reference to the accompanying drawings in which.

DETAILED DESCRIPTION OF THE PREFERRED EMBODIMENT

Write-once memory circuits, storage systems, and methods for producing and implementing such circuits and systems are disclosed herein. In the following description, for purposes of explanation, specific nomenclature and specific implementation details are set forth to provide a thorough understanding of the present invention. However, it will be apparent to one skilled in the art that these specific details are not necessarily required in order to practice the present invention.

In the following description, where "data" is referred to it will be appreciated that such "data" may be represented in various ways depending upon the context. As an example, "data" in a memory cell might be represented by a voltage level, a magnetic state, or a physical characteristic such as electrical resistance that presents a measurable effect such as voltage or current level or change to a sensing circuit, for instance. On the other hand, whilst on a bus or during transmission such "data" might be in the form of an electrical current or voltage signal. Furthermore, herein "data" in most circumstances is primarily binary in nature which may for convenience be referred to as represented by states of "0" and "1", but it will be appreciated that the binary states in practice might be represented by relatively different voltages, currents, resistances or the like and it is generally immaterial whether a particular practical manifestation represents a "0" or a "1".

A Write-Once Memory System

An embodiment of the present invention that is described in detail hereinafter provides a portable, inexpensive, rugged memory system that is particularly useful for data storage in appliances such as digital cameras and portable digital audio devices, amongst other things, although those skilled in the art will appreciate that the memory system and its various components and aspects can also be used in many other applications. In the described embodiment, the memory system is incorporated into an industry standard portable interface card (PCMCIA or CF) so that it can be used in existing and future products with such interfaces.

Figure 1:
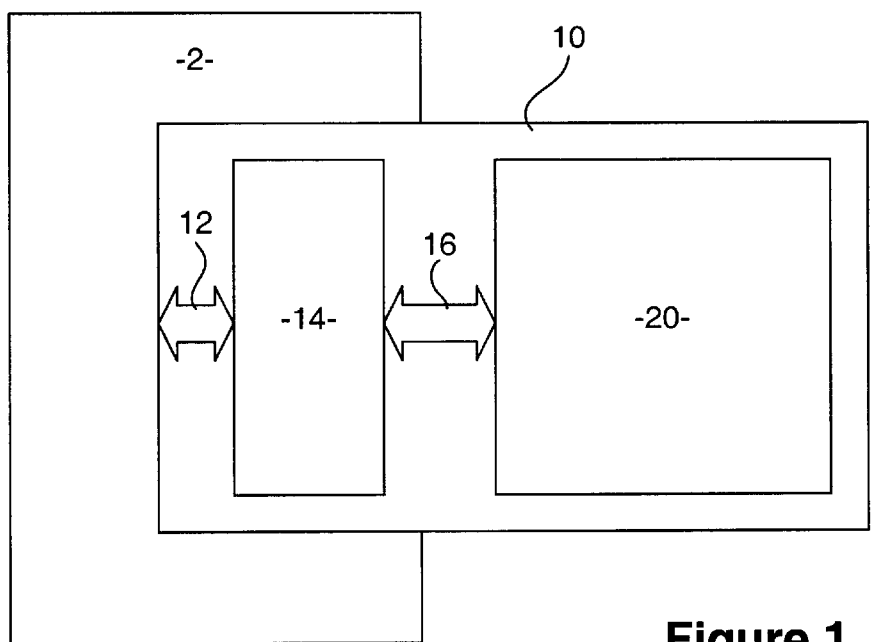
FIG. 1 is a block diagram of a write-once memory system according to an embodiment of the invention.

A memory card 10 is illustrated in block diagram form in FIG. 1, constructed according to the preferred embodiment of the invention. The memory card 10 has an I/O interface connector 12 through which communication is made between the card 10 and a device 2 to which it is coupled. The interface connector is coupled to an interface and control circuit 14 which is connected to a removable memory module 20. The memory module 20 provides circuitry for write-once data storage, including some detection, write enabling and addressing functions. The interface and control circuit 14 comprises circuitry for control, interface, detection, error correction coding (ECC) and the like for each removable memory module 20 when it is received in the card. The memory module 20 is received in a socket or the like in the memory card, so that it may be removed therefrom and replaced with another memory module 20. When received in the memory card, the memory module 20 is coupled to the interface and control circuit 14 through an internal interface 16.

Write-once data storage means that, effectively, data can only be written once to the memory and thereafter it remains unchangeable. In many forms of write-once memory it is not strictly true that the data stored therein cannot be changed at all after being initially written, however in general it cannot be changed arbitrarily, as those skilled in the art will appreciate. For example, most write-once memories are fabricated with each memory cell in a first binary state (e.g. representing a binary data "0"), and during a write procedure selected memory cells are changed into a second binary state (e.g. to represent the binary data "1"s). Often the change in the memory cell from the first binary state to the second is irreversible, such that once a data "1" is written it cannot be changed back to a data "0". This restricts the changes to the stored data that can be made after it has been written to the memory, wherein arbitrary data can only be written once and thereafter data "0"s, for example, can only be changed to data "1"s, and not the other way around.

Since the memory module 20 contains write-once memory, it is appropriate for archival data storage wherein the data, once stored, is preserved. This is somewhat like a photographic film, where pictures are stored thereon once, and the developed film is kept as a permanent record. Therefore, once the memory module 20 has been filled to capacity with data, another is required for further data storage. It would be possible to simply replace the entire memory card 10 in the device 2, however that would mean the interface and control circuitry, as well as the memory card structure, is archived along with the memory module. In order to reduce the data storage costs it is desirable that reusable and relatively expensive components of the memory system not be permanently coupled to the actual storage memory, and for that reason the memory module 20 is removable from the memory card 10 in the preferred embodiment. The bulk of the memory card 10 thus involves a one-off cost, and the memory modules 20 for insertion therein are fabricated inexpensively as discussed further hereinbelow.

The control/interface circuitry 14 may generally resemble an "AT" style disk controller circuit, further including error correction (ECC) and defect management functions, as well as functions required to operate the memory module 20. These functions include:

writing to the memory module including setting write voltages, setting write enable lines and controlling power supply striping;

addressing the memory by converting logical addresses to address line patterns required to access physical memory locations;

data read processing of sense line outputs; and parallel to serial conversion if required.

The control/interface circuitry 14 may also provide functions to emulate certain features of rewritable memory cards, such as logical deletion of data files and the like. Such functions of the interface/control circuitry 14 can be implemented without difficulty in a custom integrated circuit, for example. The details of the required functions outlined above will become more fully understood from the following description of the structure and operation of the memory module 20 itself.

For coupling between the interface/control circuitry 14 and memory module 20 in the memory card 10, the internal interface 16 is provided. Physically, the internal interface 16 receives the memory module and provides electrical connections between the interface and control circuitry and memory module. Thus, a suitable form of plug and socket arrangement may be employed, although the most appropriate structure depends strongly upon the actual number of connections to be made. Connecting contacts on the memory module can be formed on the external surface thereof, for example as described hereinafter, to enable edge connection schemes or land grid array (LGA) connections. Many kinds of connection schemes are possible, as will be recognized by those of skill in the art, for implementation without undue difficulty.

A Write-Once Memory Module

The memory module 20 can be constructed inexpensively utilizing the principles of the present invention, so as to provide a low cost per unit of data storage. In order to keep the memory cost low whilst achieving high storage capacities, several factors have been addressed, such as material and processing costs. Such features of the preferred embodiment memory module are discussed in the description hereinbelow, beginning with the general structure of the memory module 20.

Figure 2:
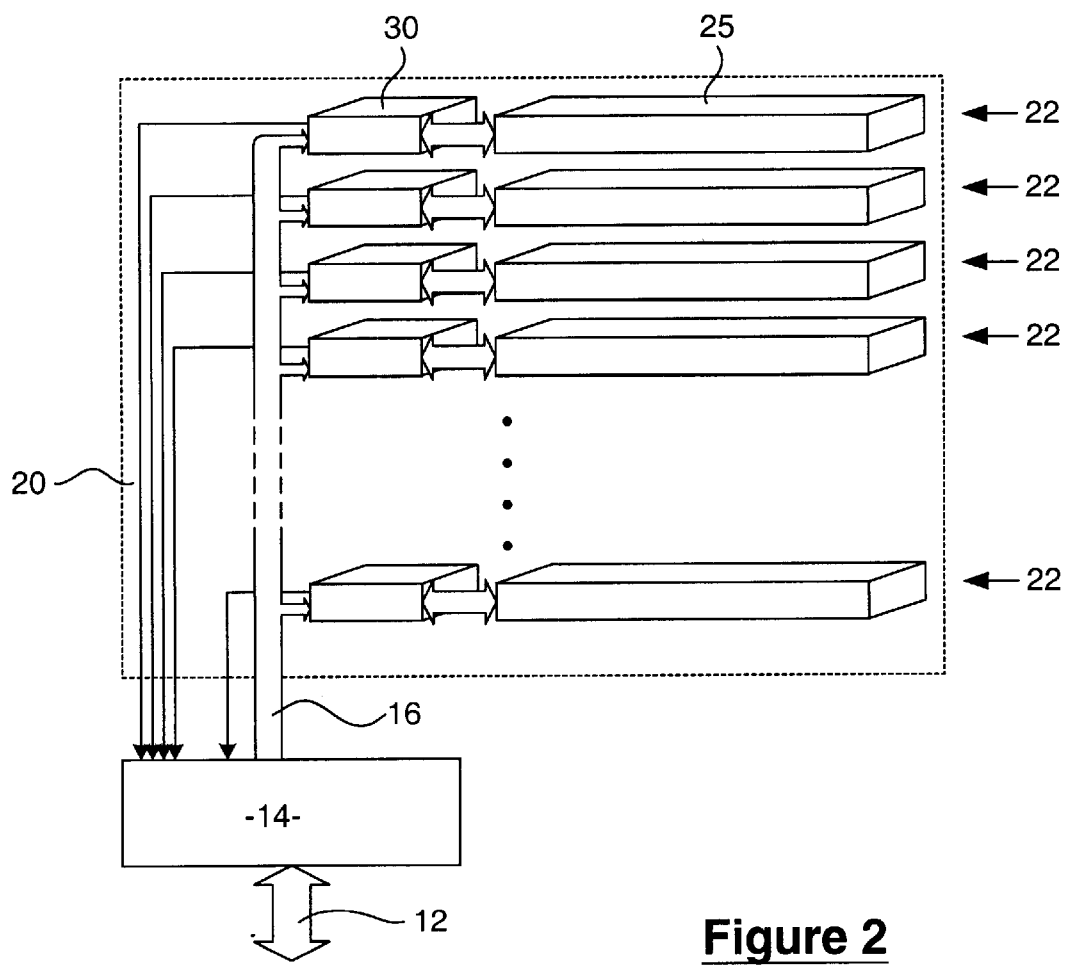
FIG. 2 is a schematic block diagram of the write-once memory system illustrating the general structure of a memory module thereof.

A diagrammatic block representation of a memory module 20 is shown in FIG. 2, coupled to an interface and control circuit 14. In order in increase storage capacity of the memory module for a given base area, the module 20 is constructed from a stack of laminated layers 22. Each layer 22 has an array 25 of memory elements that provide the data storage. The layers also each include multiplexing circuitry 30 coupling the respective memory arrays through the memory system internal interface 16 to the interface and control circuit 14. The mux/demux circuitry on each layer enables fewer interconnecting conductors between the layers of the memory module, which facilitates ease of fabrication and thus lowered costs. The address lines control which element in the memory array is connected to the sense line or lines of that layer. To minimize the number of interconnections the address lines are connected in parallel across all the layers however each layer must contain at least one sense line. There can be more than one sense line in an array. For example, redundant information can be gathered from the row and column electrodes as to the state of an addressed bit or from multiple sense lines connected to the rows or columns. There may also be multiple memory arrays on each layer each with common address lines and independent sense lines. Also one array may be contiguous over several physical layers. During the write process the address lines serve as write enable lines allowing independent data to be written on a series of bits addressed in common.

Figure 3:
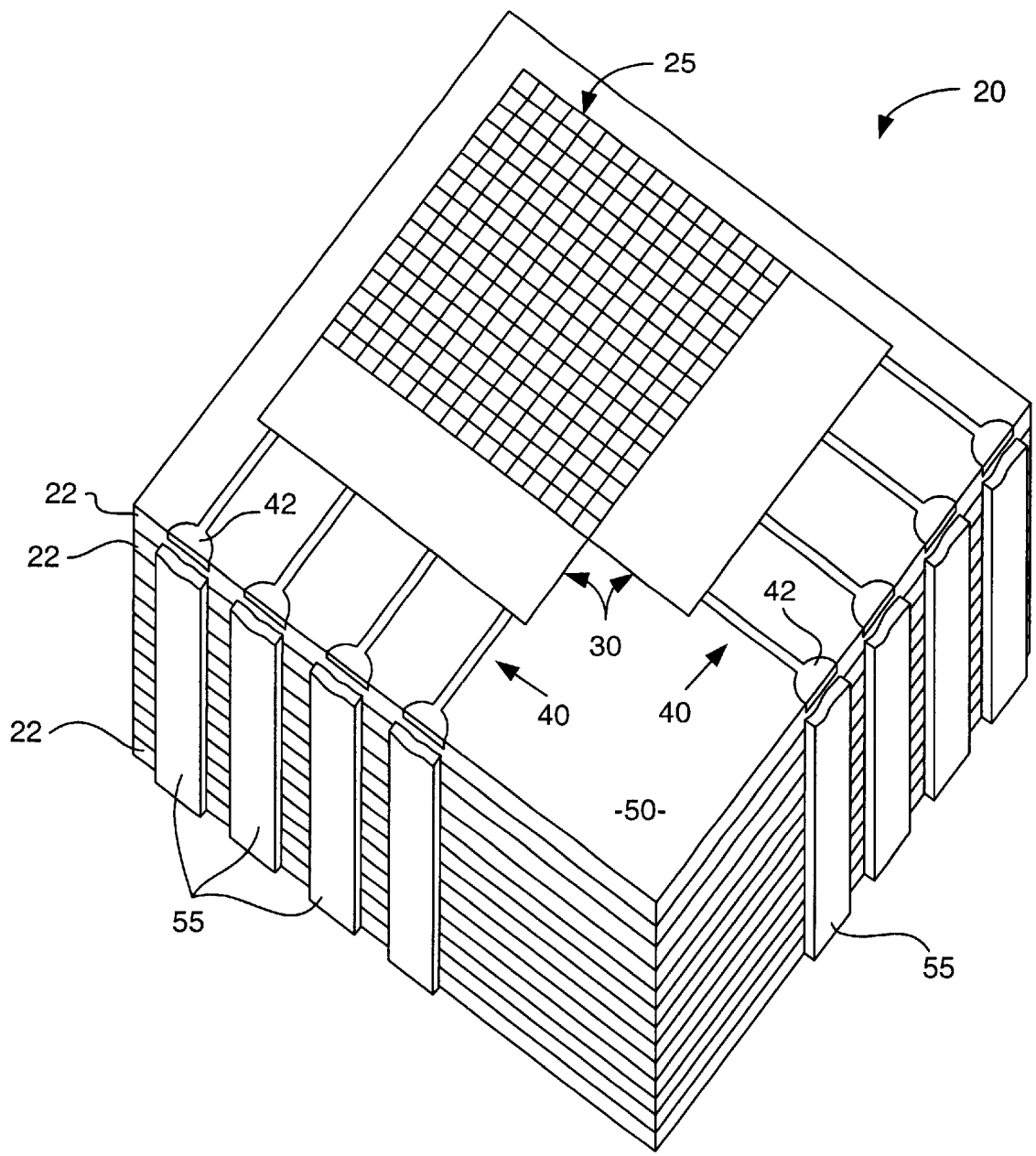
FIG. 3 is a cut-away isometric view of a write-once memory module constructed in accordance with an embodiment of the invention.
Figure 4:
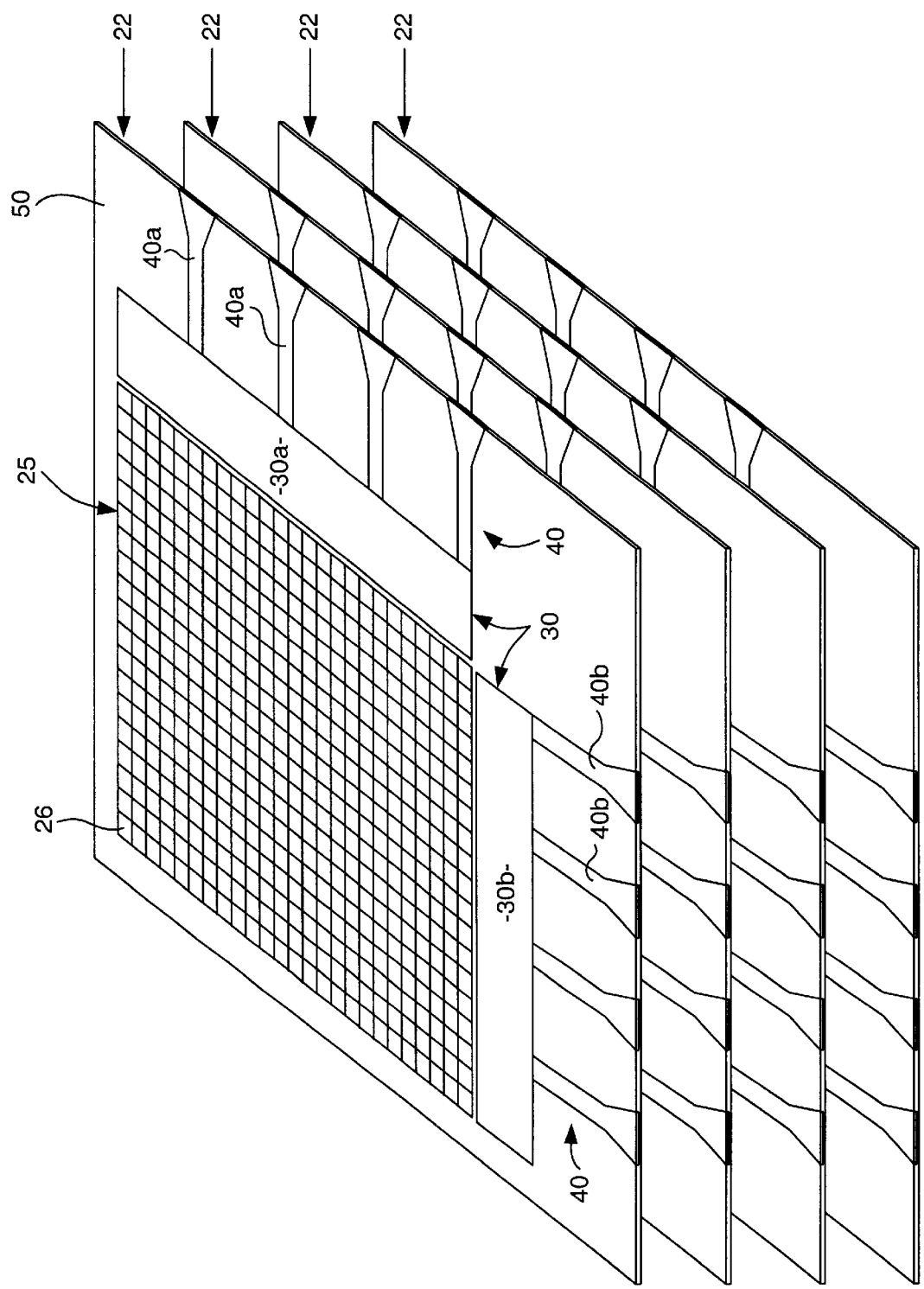
FIG. 4 is an exploded view of layers in a write-once memory module according to an embodiment of the invention.
Figure 5:
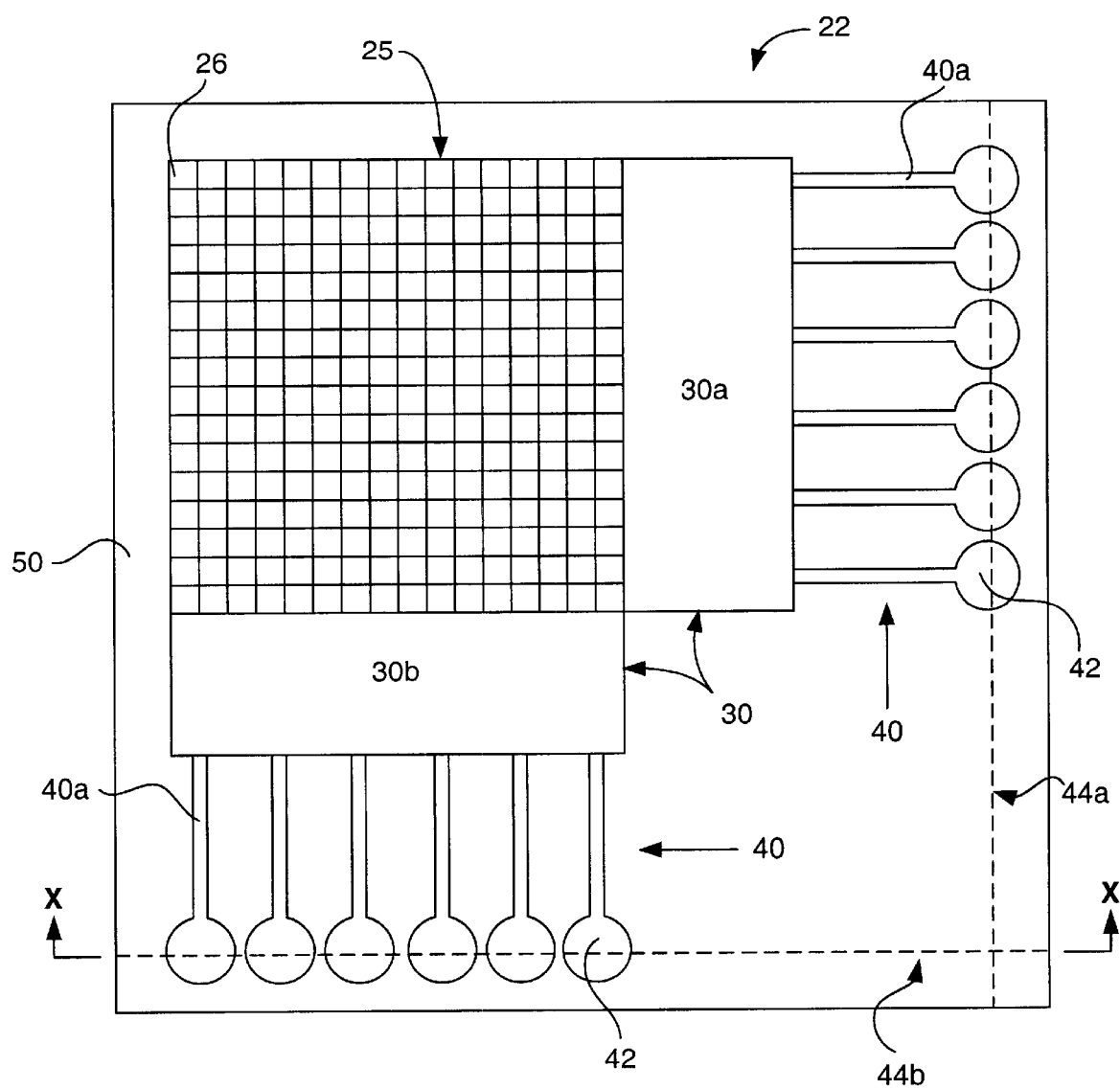
FIG. 5 is a simplified plan view of a memory module layer prior to assembly into a memory module.
Figure 6:
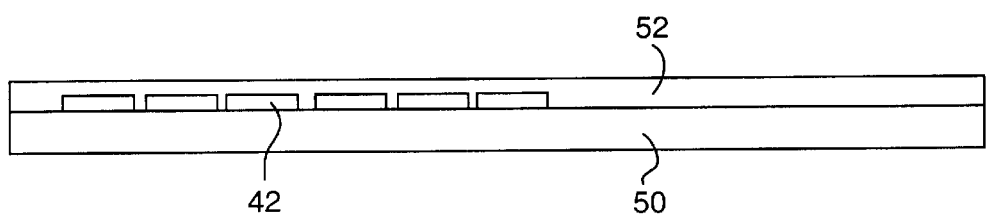
FIG. 6 is a cross-sectional view of the memory module layer of FIG. 5, looking into section X-X.

Referring to FIGS. 3 and 4, the physical arrangement of the memory module layers 22 is illustrated. In particular, FIG. 3 is a cut-away isometric view of a memory module 20, and FIG. 4 is an exploded view of several layers 22 of a memory module. Additionally, FIG. 5 is a plan view of a memory module layer 22 illustrating an example of the arrangement of components thereon.

Each of the layers 22 comprises a memory array 25 or multiple arrays or a portion of an array and mux circuits 30 formed on a substrate 50 using an integrated circuit process described in greater detail below. The memory array 25 comprises a matrix of memory elements 26. The mux circuits 30 comprise column and row mux circuit portions 30a and 30b that are positioned adjacent respective orthogonal edges of the memory array 25. Input/output (I/O) leads 40 are also formed on the substrate during the fabrication process. In the memory module 20, row I/O leads (40a) extend from the row mux circuit 30a to a first adjacent edge 44a of the substrate, and column I/O leads (40b) extend from the column mux circuit 30b to a second adjacent edge 44b of the substrate. Each of the leads 40 terminate at respective contact pads 42, portions of which are exposed at the edges 44a and 44b of the substrate 50.

A plurality of layers 22 are stacked in the same orientation (FIG. 4) and laminated together (FIG. 3). Electrical contact is made to the exposed portions of the contact pads 42 of the stacked layers by conductive contact elements 55, which are illustrated in partial cut-away view in FIG. 3. The contact elements 55 extend along the sides of the memory module 20, transverse to the plane of the individual layers 22. Each contact element 55 as illustrated makes electrical contact to a respective contact pads of a plurality of the layers in the stack. The contact elements 55 can be used to couple the memory module 20 through the memory system internal interface 16 to the interface and control circuit 14.

In the preferred implementation of the memory module the substrate 50 for each of the layers 22 is formed from a thin inexpensive material such as a plastic (e.g. polyimide, polyester) or metal (e.g. stainless steel). The process by which the integrated circuits (e.g. memory array and mux/demux circuitry) are formed on the substrate, and the layers assembled into a memory module is described in greater detail hereinbelow. Preceding discussion of the fabrication processes and materials, however, is a description of the memory module circuitry, in particular the memory array and elements and the integrated multiplexing scheme.

A Write-Once Memory Array

Figure 7:
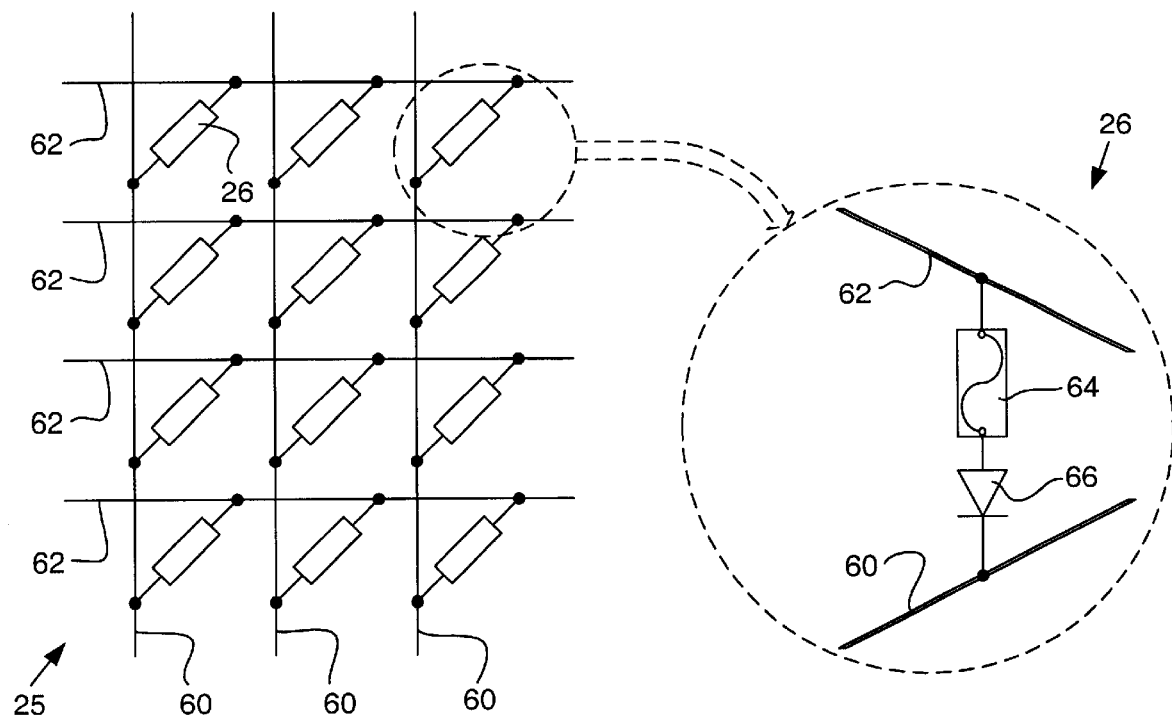
FIG. 7 is a pictorial diagram of a cross-point memory element suitable for implementation in embodiments of the invention.

An array 25 of memory elements 26 is formed on each of the layers in the memory module 20. The memory array comprises a regular matrix of column lines and row lines with a memory element at each column/row intersection. FIG. 7 illustrates a schematic diagram of a portion of a memory array 25 having column lines 60 and row lines 62. Coupled between each of the column lines and row lines is a memory element 26, which is also shown in greater detail in an expanded portion of the diagram in FIG. 7. In the preferred implementation of the memory array, each memory element 26 schematically comprises a fuse element 64 coupled in series with a diode element 66, although in practice the fuse and diode functions may be provided by the same element. The fuse element 64 provides the actual data storage effect of the memory element, whilst the diode 66 facilitates addressing of the memory element using the row and column lines for writing and reading data.

The operation of the memory array 25 is as follows. At fabrication, each of the memory elements 26 has a fuse element 64 that is conductive. The conductive state of the fuse element represents one binary data state, say a data "0". In order to write data to the memory array, each memory element in which it is desired to store a data "1" is addressed using the column and row lines and the fuse element therein is "blown", placing it in a non-conductive state. The non-conductive state of the fuse element represents the other binary data state, say a data "1".Blowing the fuse element is, in most cases, a one-way operation, which makes the memory a "write-once" storage, as discussed hereinabove. A data writing operation (e.g. writing a data "1" to a selected memory element) can be performed by applying a predetermined current through a selected row line to a selected column line, for example, sufficient to blow the fuse of the memory element that directly interconnects those row/column lines. Data can be read from the memory array by addressing memory elements using the column and row lines and sensing which memory elements are conductive (data "0"s) and which are non-conductive (data "1"s). More generally, the binary data states of memory elements are distinguished by some ratio between "conductive" resistance and "non-conductive" resistance.

It will be appreciated that, although the above description refers to fuse elements in the memory array that are fabricated in a low resistance state and blown to create a high resistance state, it is equally possible to create a memory array using "anti-fuse" elements that operate in the opposite manner. In that case, the memory elements are fabricated in a high resistance state, and blown to create a low resistance. The anti-fuse in each memory element is also formed in series with a diode for the reasons mentioned above. The diode and anti-fuse are separate in this case, since the diode function is required after the anti-fuse has been blown.

A mandatory characteristic for the fuse or anti-fuse element is that its resistance change between a high state and a low state irreversibly or the reverse at some critical current threshold. The change in resistance must be substantial: several orders of magnitude. The critical current of the fuses should also be controllable by the area of the devices. The area of the device may simply be determined by the area of intersection of the row and column electrodes or may be lithographically defined. The fuse and diode elements can be formed from a number of thin films deposited in series between the row and column electrodes. The individual memory elements occur at the intersection of the row and column electrodes. Although the fuse and diode layers are deposited as contiguous films covering the entire area, they may be patterned by a number of means (laser ablation, photolithography, soft lithography) to minimize cross talk between individual devices.

The diode element 66 in each memory element 26 of the array assists in addressing the memory elements uniquely using the column and row lines for writing and reading data. Without a diode in the row/column cross-point memory elements there are current paths through many memory elements between a given column line and row line. However, with the diodes element forming a one-way conduction path through each memory element, a single column line and single row line can be used to uniquely address a single memory element. In other words, forming a circuit from one row line to one column line permits current to pass through only a single memory element. By applying a predetermined "data writing" current through that circuit, the fuse in the memory element can be blown to change a data "0" to a data "1".Also, by sensing the resistance in the circuit it is possible to determine whether the memory element fuse is blown or intact, thereby reading a data "1" or data "0".

Thus, the diodes 66 eliminate cross-talk between the memory elements in the memory array during reading and writing operations. Furthermore, the non-linear current-voltage (I-V) characteristics of the diodes improves the data sensing signal-to-noise ratio (SNR), which assists in remote sensing and addressing. The data in the memory module is sensed remotely since the sensing circuitry is in the interface and control circuit 14, which is contained in a separate integrated circuit. Also, permuted diode logic is employed for addressing of the memory elements, using the mux circuits as described hereinbelow, in order to reduce the number of connections required between the memory module 20 and the interface and control circuit 14.

Figure 8:
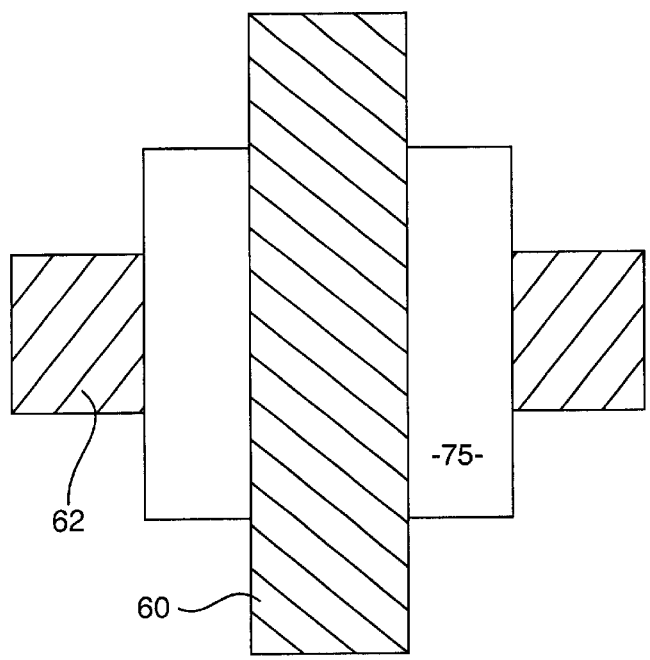
FIG. 8 is a simplified plan view of a cross-point array memory unit cell.

The memory array is sometimes herein referred to as a cross-point array memory, in view of the preferred structure thereof which is discussed in greater detail elsewhere in this description. FIG. 8 is a simplified plan view of a unit cell of the memory array of the preferred embodiment. The basic structure of the cross-point array memory comprises two layers of orthogonal sets of spaced parallel conductors arranged with a semiconductor layer therebetween. The two set of conductors form row and column electrodes overlaid in such a manner that each of the row electrodes intersects each of the column electrodes at exactly one place. At each of these intersections a connection is made between the row electrode (62 in FIG. 8) and column electrode (60 in FIG. 8) through the semiconductor layer (75 in FIG. 8) which acts in the manner of a diode and a fuse in series. The diodes in the array are all oriented so that if a common potential is applied between all the row electrodes and all the column electrodes then all the diodes will be biased in the same direction. The fuse element may be realized as a separate element which will open when a critical current is passed through it or it may be incorporated in the behavior of the diode.

Although commonly in this description the semiconductor layer (e.g. 75) is referred to in the singular, in practice a plurality of layers of different materials may be employed. The layers may include materials that are not semiconductors, such as metals and even dielectrics in various configurations. The materials and structures suitable for implementing the desired functions are described in detail elsewhere.

Figure 9:
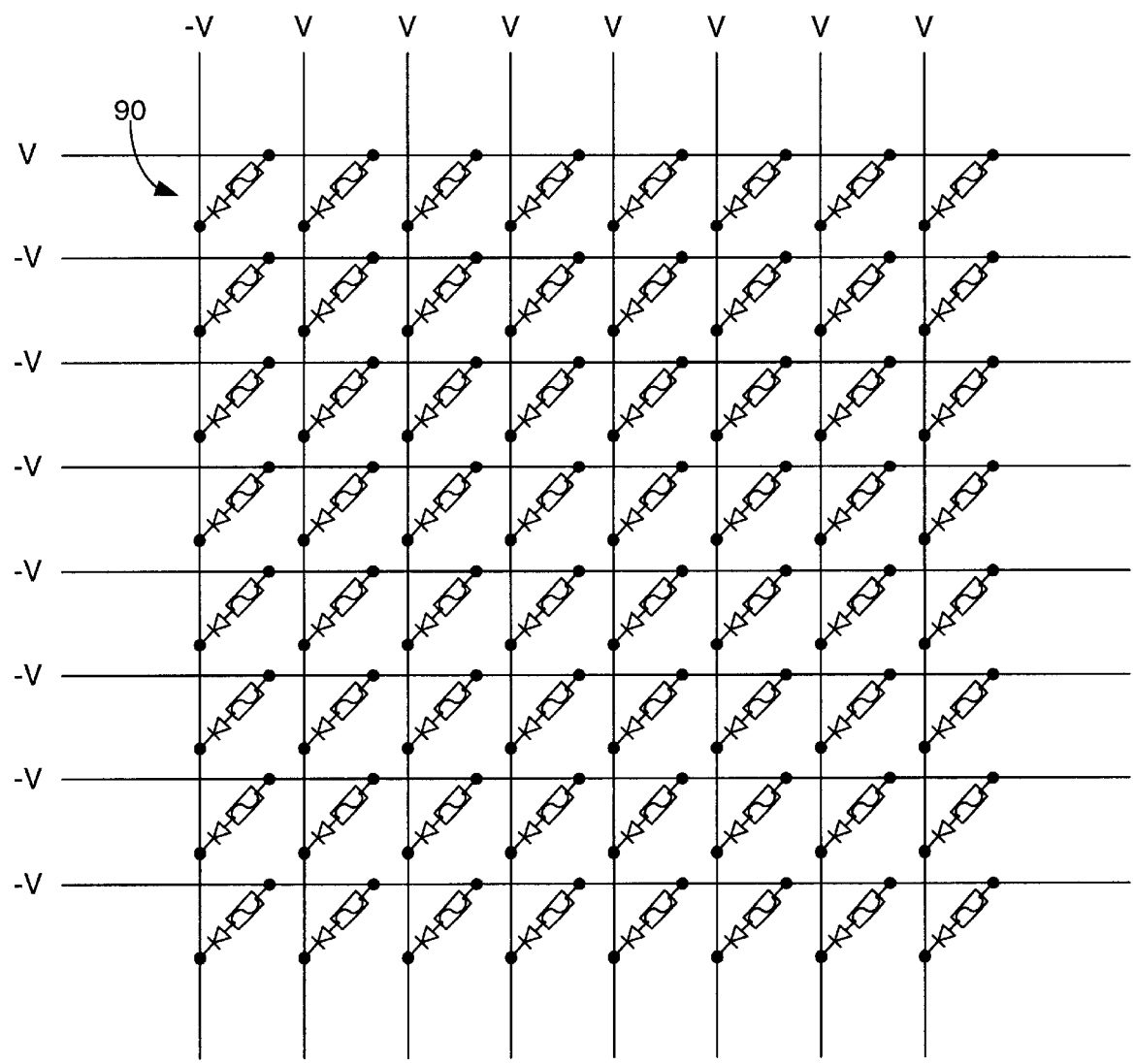
FIG. 9 shows a write-once memory array for illustration of addressing memory elements thereof.

FIG. 9 is a schematic representation of a cross-point write-once diode memory array. The figure shows an eight row by eight column array. If voltages are applied to the row and column electrodes as depicted (i.e. all the column electrodes are a potential V except for one which is at −V, and all the row electrodes are at −V except for one which is at V), then only one diode will be forward biased. For the case depicted in FIG. 9 only the diode in the upper left corner (90) of the array will be forward biased. The diodes in the top row and left-most column will have no bias on them and the remaining diodes in the array will be reverse biased. This constitutes an addressing scheme for the array. If a current flows between the rows and columns with the electrodes at these potentials then the fuse of the upper left diode is intact (e.g. representing a data "0"). Conversely, if no current flows in this configuration then the corresponding diode/fuse has been blown (e.g. representing a data "1"). By modulating the amplitudes of the voltages applied to the array electrodes more current can be made to flow through the selected diode. If this voltage produces a current that exceeds the threshold current of the fuse then the fuse can be blown, changing the state of the memory element. This constitutes a method for writing to the memory.

The actual current required to blow a fuse in the memory array (or the voltage to be applied to achieve that current) should be predictable and controllable at the time of fabrication. Since it is current density through the memory elements that is the operative factor, the applied voltage/current at which an element will blow can be adjusted by varying the junction area of the element. For example, if the cross-sectional area of the intersection of the cross-point electrodes is reduced this also reduces the current/voltage required to be applied to reach the critical current density to blow the fuse. This scheme can be used in the design and fabrication of the memory circuits to ensure that control voltages can be applied to blow only the desired cross-point fuses.

Memory Array Multiplexing/De-multiplexing Circuitry

In order to simplify interconnections to the memory module it is desirable to use a multiplexed addressing scheme for accessing the memory elements. In other words, it is desirable that each memory element in a memory array be uniquely addressable from an external circuit through addressing lines that are fewer in number than the total of the array row and column lines. To that end, multiplexing and de-multiplexing circuitry (30) is included on the same substrate as the memory array. Preferably the mux circuits are constructed from a logic family that is compatible with the memory array, so that a simple fabrication process can be maintained. Indeed, as described hereinbelow, it is possible to construct the mux circuits using the same kind of simple devices used in the memory array.

Figure 10:
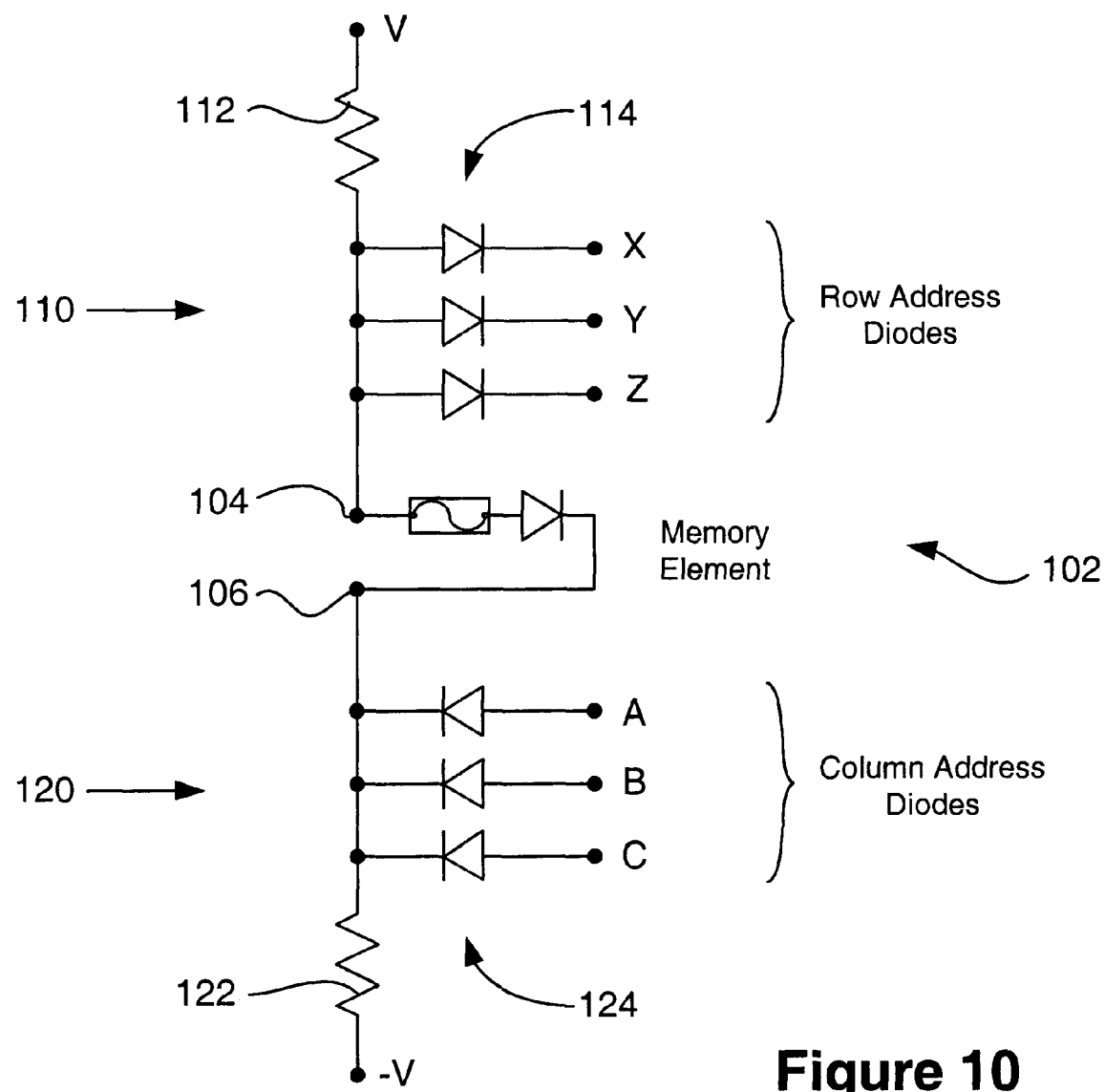
FIG. 10 is a schematic circuit diagram of a portion of a memory array addressing circuit.

In the preferred embodiment, the address mux functions are carried out using a logic scheme referred to as permuted diode logic which is described hereinbelow. FIG. 10 illustrates a single write-once memory element 102 represented by a fuse and diode in series. The memory element 102 is coupled between a row electrode 104 and a column electrode 106. A row address diode logic circuit 110 is coupled to the row electrode 104, and a column address diode logic circuit 120 is coupled to the column electrode 106. The row address circuit 110 as shown comprises a resistive element 112 coupled between the row electrode and a pull-up voltage +V. The row address circuit 110 also comprises plurality of row decode diodes 114 having anodes coupled to the row electrode and cathodes controlled by respective row address input voltages represented by X, Y and Z. A column address diode logic circuit 120 is similarly constructed with a resistive element 122 coupled from the column electrode 106 to a pull-down voltage −V. A plurality of column decode diodes 124 have their cathodes coupled to the column electrode, and anodes controlled by respective column address input voltages represented by A, B and C.

Consider firstly the row address circuit 110 in which logic levels of +V and −(V+ΔV), where ΔV is the diode threshold voltage for conduction, are used for the row address input voltages (X, Y, Z). It will be apparent that, where voltage +V represents a logic "1", the row address circuit 110 acts like an AND gate with the diode cathodes (X, Y, Z) as inputs and the row electrode 104 as output. The row electrode 104 is high (+V) only if all three row address inputs (X, Y, Z) are high. Similarly, the column address circuit 120 acts like a negative logic AND gate (e.g. a NAND gate). In this case, if logic levels of −V and (V+ΔV) are applied at the column address inputs (A, B, C), the output at the column electrode 106 will only be −V when all three inputs are at −V. If the row address inputs (X, Y, Z) all apply cathode voltages of +V to the diodes 114 and the column address inputs (A, B, C) all apply anode voltages of −V to the diodes 124 then the memory element 102 is selected. Although in FIG. 10 only three-input circuits are illustrated, this addressing scheme can be extended to include an arbitrary number of inputs.

There are $n^d$ permutations when one item is selected from each of d groups of n nodes. Therefore, $n^d$ electrodes can be connected through diodes to one out of n nodes in each of d groups. If a high logic level is applied to exactly one node in each group then only one electrode will be selected, since all lines connected to an electrode must be high to select it and no two electrodes share the identical connections.

Figure 11:
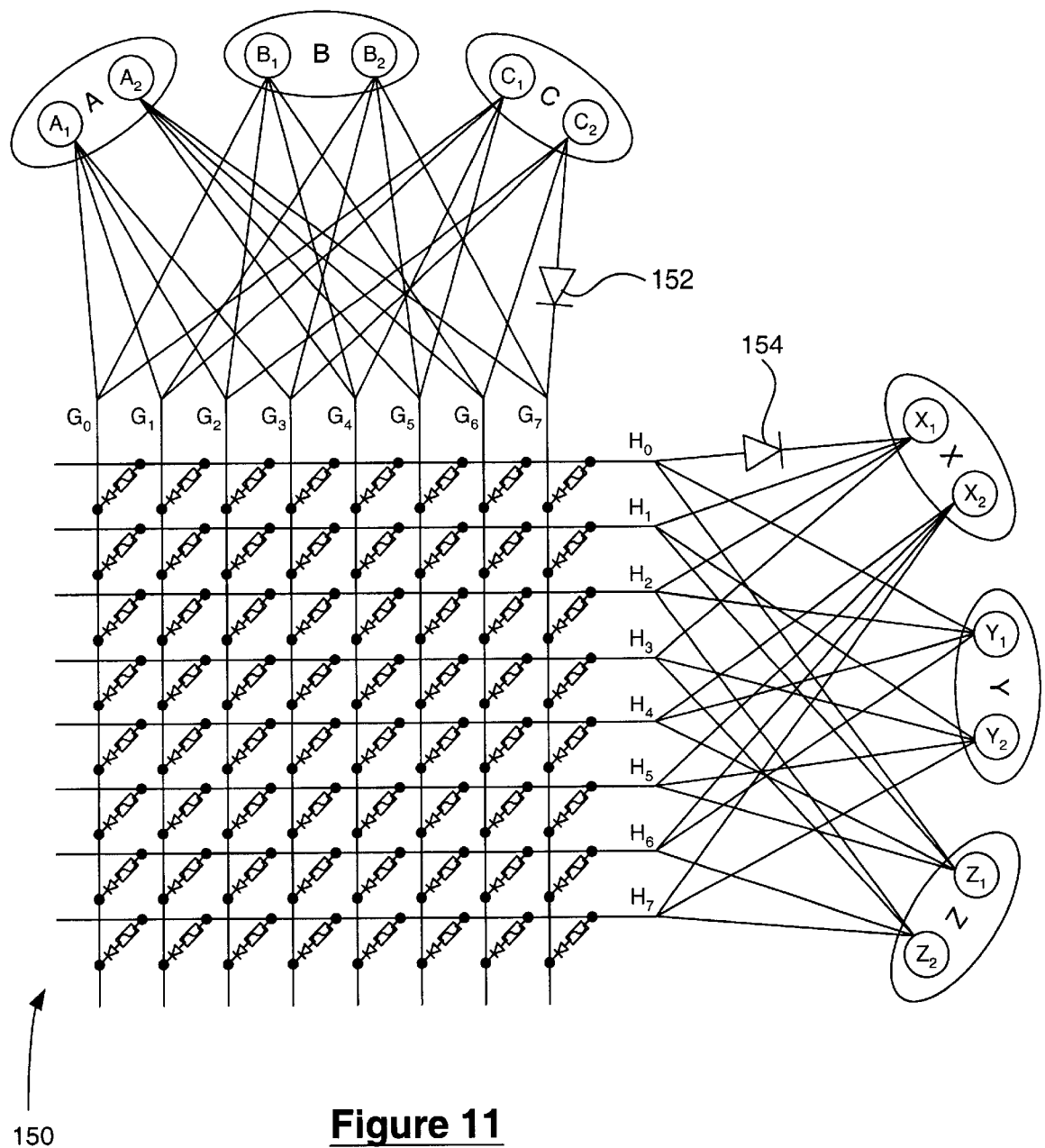
FIG. 11 shows a cross-point memory array with permuted diode logic addressing circuit connections illustrated schematically.

FIG. 11 schematically illustrates an 8×8 write-once memory array 150 having row and column electrodes coupled for addressing memory elements as described above. For reference, the column electrodes of the memory array 150 are labeled $G_0$ to $G_7$, and the row electrodes are labeled $H_0$ to $H_7$. Three addressing groups are provided each of the rows (X, Y, Z) and columns (A, B, C). Each of the addressing groups has two complementary addressing nodes (e.g. $A_1$ and $A_2$), and each node is coupled to four of the eight corresponding row/column electrodes. The connection pattern between the nodes and row/column electrodes is different for each addressing group. In the example of FIG. 11, the connection pattern is as follows:

| Column Electrode Address Node Connections | | | | | |
|---|---|---|---|---|---|
| $A_1$ | $A_2$ | $B_1$ | $B_2$ | $C_1$ | $C_2$ |
| $G_0$ | $G_4$ | $G_0$ | $G_1$ | $G_0$ | $G_2$ |
| $G_1$ | $G_5$ | $G_2$ | $G_3$ | $G_1$ | $G_3$ |
| $G_2$ | $G_6$ | $G_4$ | $G_5$ | $G_4$ | $G_6$ |
| $G_3$ | $G_7$ | $G_6$ | $G_7$ | $G_5$ | $G_7$ |

| Row Electrode Address Node Connections | | | | | |
|---|---|---|---|---|---|
| $X_1$ | $X_2$ | $Y_1$ | $Y_2$ | $Z_1$ | $Z_2$ |
| $H_0$ | $H_4$ | $H_0$ | $H_1$ | $H_0$ | $H_2$ |
| $H_1$ | $H_5$ | $H_2$ | $H_3$ | $H_1$ | $H_3$ |
| $H_2$ | $H_6$ | $H_4$ | $H_5$ | $H_4$ | $H_6$ |
| $H_3$ | $H_7$ | $H_6$ | $H_7$ | $H_5$ | $H_7$ |

The connections between the column electrodes and column addressing nodes each include a diode coupled as shown at 152, and the connections from row electrodes to row addressing nodes each include a diode coupled as shown at 154. Most of these diodes are not shown in the FIG. 11 diagram so as to avoid unnecessary complication. Although the topology in this example shows the address lines all connected to one end of the electrodes in the array, the address lines may just as easily be connected to either or both ends of the electrode (sides of the array).

The memory array 150 is addressed by applying voltages at the addressing nodes ($A_1$, $A_2$, etc.). An enabling voltage is applied at only one node from each addressing group. This allows a single memory element from the array 150 to be selected, in the manner described above in relation to FIG. 10.

According to this scheme, a cross-point array of N memory elements requires $2\sqrt{N}$ row and column electrodes. These electrodes can be addressed by $2d^{2d}\sqrt{N}$ address lines where d is the order of the network. For example $10^8$ memory elements will require a total of 20000 row and column electrodes, but can be addressed by 400 lines with a second order network (2 groups of 100 nodes for the rows and the same for the columns) or 80 lines for a fourth order network (4 groups of 10 nodes for the rows and the same for the columns).

Another simple approach is simply to consider the possible combinations of m electrodes taken p at a time. The maximum number of combinations will be obtained when p~m/2. It can be shown that for the simple combinatorial scheme the number of electrodes addressed my m address lines is approximately $2^m\sqrt{(2/(\pi m))}$ Addressing Over Multiple Memory Module Layers The above described system for sensing the state of an addressed memory element relies on the addressed diode memory element being the only current path between the row and column electrodes. If parallel addressing is used in the memory module, however, this creates the possibility of more than one conduction path between the row and column address lines, which creates difficulties in using that sensing scheme. Accordingly, an enhanced method and system for detecting the state of an addressed memory element is presented hereinbelow.

As mentioned, the preferred structure of a memory module herein disclosed comprises a stack of multiple layers. Each layer includes a write-once memory array, wherein the memory arrays of the various layers share common addressing lines so as to reduce the number of connections required to external circuitry. For example if a memory module consists of m layers each containing an array with N memory elements, $\sqrt{N}$ row electrodes and $\sqrt{N}$ column electrodes, then when the $i^{th}$ row and $j^{th}$ column are addressed on one layer they are addressed on all layers. This is desirable for two reasons. First, by being able to read m layers in parallel the read and write rates required to achieve a given serial bit rate are divided by m. Secondly, if separate address lines are required for each layer of the memory then the number of connections from layer to layer and from the memory module to the interface and control circuitry can become unmanageable.

The preferred solution to the parallel addressing difficulty involves including an additional sense diode to each row and/or column electrode at the same node to which the address diodes are connected. The other end of each row sense diode is connected to a common row sense line, and similarly the end of each column sense diode which is not connected to a respective column electrode is connected to a common column sense line. The state of an addressed memory element can be detected from either a row sense diode, a column sense diode, or both. In view of the symmetry of the preferred array construction, it will be appreciated from the description hereinafter that the row and column electrodes are in fact functionally equivalent.

The state of an addressed memory bit is determined by the current which flows through the sense line to a suitably chosen bias point. In order for current to pass through either sense line two conditions must be met: (1) the diode memory element must be addressed, and (2) the fuse of that element must be in the high resistivity state. In all other cases the diode is not addressed and, regardless of the state of the fuse, the corresponding row and/or column sense diode will not be forward biased and will not conduct current. Therefore, if a single sense line is connected to all the row (or column) electrodes and one memory element in the row and column array is addressed, then the state of that memory element can be unambiguously determined.

The use of row and column sense lines provides redundancy without compromising the speed of the readout process and thereby improving the signal detection margin. Note that redundancy can also be added by including additional sense lines to either the row or column electrodes and/or by adding extra diodes in parallel to the connection between the sense lines and the row or column electrodes.

Figure 12:
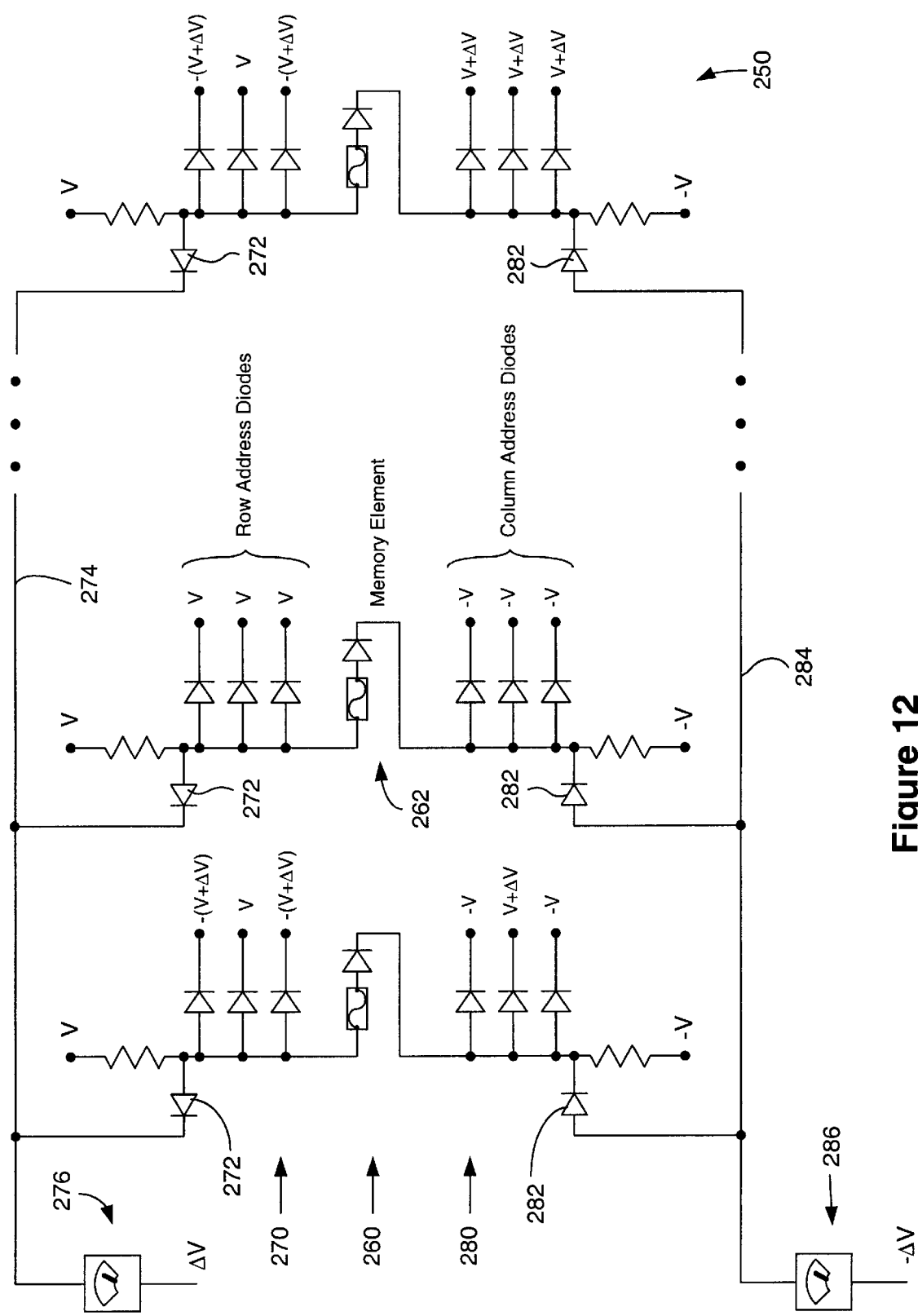
FIG. 12 is a schematic circuit diagram of a permuted diode logic multiplexing/de-multiplexing (mux/demux) and sensing circuit for a memory array.

FIG. 12 shows a schematic diagram of addressing and sensing circuitry 250 utilizing the techniques described above. A plurality of memory elements 260 from a write-once memory array are illustrated, coupled to their respective row and column addressing circuits 270, 280 which are constructed to address the memory array as described hereinabove. The circuitry 250 also includes a common row sense line 274 and a common column sense line 284. The common row sense line 274 is coupled to each of the memory array row electrodes through respective row sense diodes 272. In particular, each diode 272 has its anode coupled to the corresponding row electrode and its cathode coupled to the common row sense line. Similarly, column sense diodes 282 are coupled from the common column sense line 284 to the respective column electrodes of the memory array. The cathodes of diodes 282 are coupled to the respective column electrodes, and the anodes thereof coupled to the common column sense line.

In the example as shown the center memory element (262) is addressed. This is because memory element 262 is the one coupled to both the row and column electrodes that are selected by the addressing circuits. As shown in the Figure, memory element 262 corresponds to the addressing circuits in which none of its row or column address diodes are in conduction due to the voltages applied thereto. If the fuse of memory element 262 is blown then currents will flow through both sense diodes 272, 282 and in both the row and column sense lines 274 and 284. If the center memory element is intact then no currents will flow in either sense line regardless of the state of the fuses in any other memory elements in the array. In that case no current will flow through the sense diodes corresponding to the addressed memory element, and all other memory elements are unselected since the addressing scheme ensures that at least one of the address diodes will be in conduction thereby guaranteeing that the corresponding sense diode will be reverse biased.

If more than one row or column electrode in the array is addressed then the state of the memory elements at the intersections of all the addressed lines may still be determined provided that at least one end of each memory element can be connected to a sense line which is separate from the others. This configuration will result in reduced detection margins. For example consider two addressed rows and one addressed column. If all the addressed fuses are intact then the sense diodes appear to be connected through two resistors in parallel to one of the power supply rails and through only one resistor to the other power supply rail. In order to be able to detect this condition the bias applied to the termination of the sense lines should be adjusted closer to one of the supply rail voltages, resulting in lower currents (smaller signals) when detecting the blown fuse condition. This is not a problem when each addressed row/column intersects at most one other addressed column/row as in the case when multiple cross-point arrays share the same address lines, but have their own sense lines, and in the case of a stack of cross-point memories or when multiple non-interconnected cross-point arrays exist on a single substrate.

Figure 13:
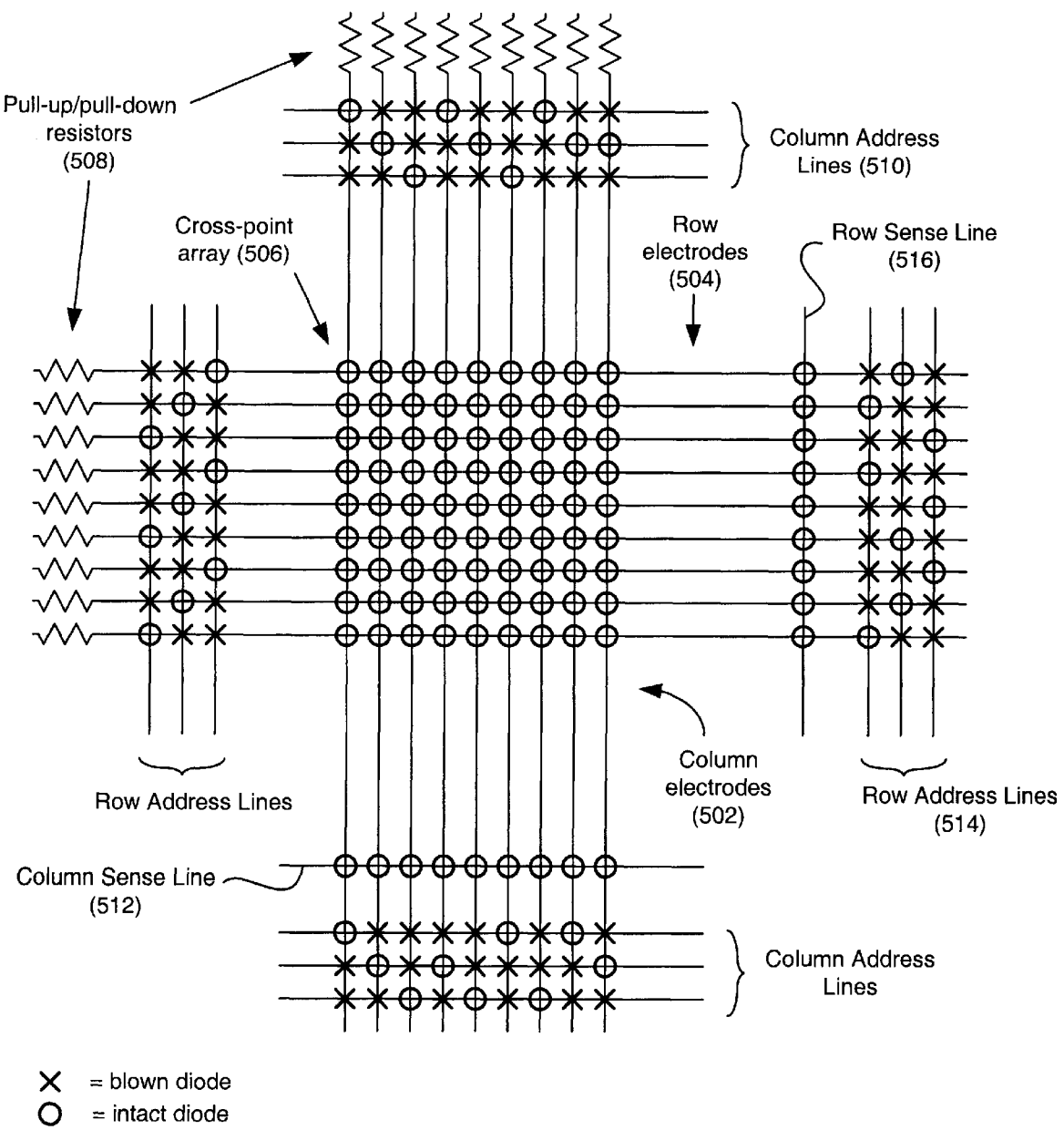
FIG. 13 is a diagrammatic layout view of a cross-point memory array and associated addressing and sensing circuit elements.

FIG. 13 is a diagrammatic layout diagram of a cross-point diode memory array with addressing and sensing circuitry of the form described above. As halo shown, column electrodes 502 and row electrodes 504 are orthogonal to one another and formed on respective layers separated by a semiconductor layer. Diodes are formed at the intersections of the electrodes, creating the cross-point diode memory array 506. In the Figure, diode elements that are intact are indicated by an "O" at the respective intersection, and diodes elements that are blown are indicated by an "X".The cross-point memory array as shown has no data stored in it and thus all of the diodes therein are intact.

The row and column electrodes extend out from the cross-point array and are terminated at their ends by pull-up/pull-down resistors 508 (corresponding to resistors 112, 122 in FIG. 10). Crossing the column electrodes between the memory array and the terminating resistors are a plurality of column address lines 510 and at least one column sense line 512. The column address lines and column sense line(s) are formed on the same conductor layer as the row electrodes so that where they cross the column electrodes diode junctions are formed therebetween. The diode elements formed by the column sense line corresponds to diodes 282 in FIG. 12, and the diodes formed by the column address lines correspond to diodes 280 in FIG. 12. The address line group/node arrangement described above is formed by blowing selected ones of the column address line elements, leaving intact the desired diode connections. This programming of the addressing circuitry can be finalized after fabrication of the circuits, as outlined below.

The row electrodes 504 are similarly crossed by row address lines 514 and a row sense line 516. The row address lines and row sense line are formed on the same conductor layer as the column electrodes, creating row address diodes (e.g. 270 in FIG. 12) and row sense diodes (e.g. 272 in FIG. 12).

At the time of fabrication, diode junctions are formed between each of the column address lines and each of the column electrodes, and between each of the row address lines and each of the row electrodes. However, in order to implement the group/node addressing scheme described above, it is necessary that only selected diode connections be maintained between addressing lines and array electrodes. The "programming" of the selected connections can be finalized after the circuit fabrication by blowing certain address diodes leaving only the selected diode connections intact. This is achieved by fabricating the address lines, for example, with a modulated line width so as to selectively vary the cross-sectional area of diode junctions to the array electrodes. As discussed above, the cross-sectional area of a given diode element can be adjusted to change the applied voltage/current that is necessary to reach the critical current density to blow that diode. Thus, the address line width is modulated so as to be narrower at certain cross-points with the array electrodes so that the diodes thereat have reduced cross-sectional areas. Then, when a programming voltage is applied to the circuits only those diodes with reduced area can be caused to blow, leaving the desired diode connections intact.

Preferably it is the width of the row or column electrode that is modulated, rather than the address line, for practical reasons related to alignment. If the address line with is modulated then the modulation must be performed over the pith of the row/column lines so that two adjacent diodes are not unintentionally blown. Modulating the width of the data lines can be done over a relatively large distance giving the freedom of relaxed alignment tolerances. Also, by extending alternate row/column lines out from opposite sides of the matrix allows the width modulation to be doubled which helps add As margin to the programming process. Furthermore, by choosing a particular arrangement of connections it can be guaranteed that no two consecutive lines extending from either side of the array will both be widened, this further increasing the margin for programming. Finally, the address and sense lines will be wider than the other row and column traces because they need to carry more current without failing during operations like addressing while writing, and the address programming operation. They can also be spaced further apart to reduce alignment tolerances.

Leakage currents in the array during sensing can be minimized using the techniques mentioned above. For example, the power connections to the ends of the row and column electrodes can be arranged in groups or stripes, wherein only the region of the array where the addressed memory element resides has power applied to it, the remaining electrodes being coupled to a high impedance state. The parallel address sensing scheme described above is unaffected by turning the power off on unaddressed portions of the memory array. The power supply striping can be used as part of the addressing scheme to maintain interconnect efficiency.

Figure 14:
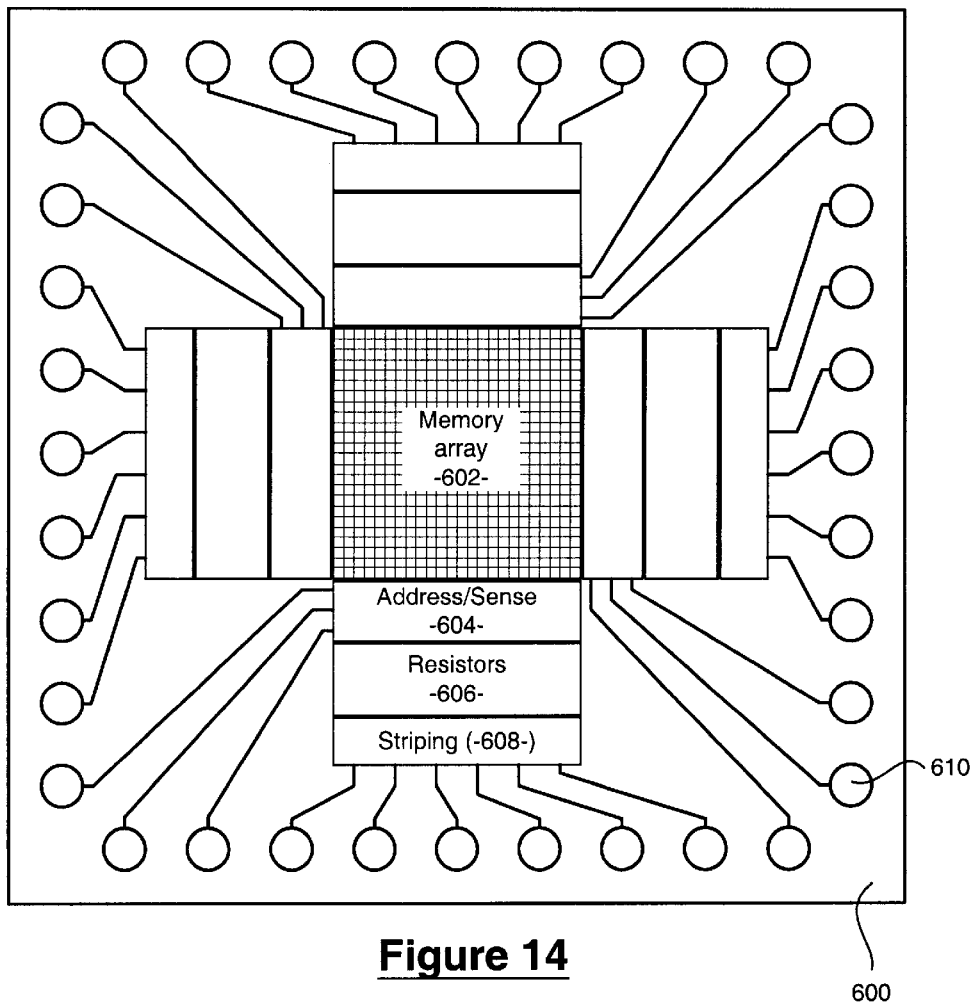
FIG. 14 is a simplified block architectural layout diagram of a memory module layer.

FIG. 14 illustrates a block architectural layout of a memory module layer 600 indicating an example of the relative positioning of the circuit components. The memory array 602 is positioned centrally, and at the periphery thereof are positioned address/sense lines 604, pull-up/pull-down resistors 606 and power supply striping couplings 608. Around the periphery of these circuits are located contact pads 610 for making external interconnections. It will be appreciated from the foregoing description that the physical architecture of the layer 600 is particularly simple, with the row/column electrodes extending out from the array through the address/sense circuits, resistors and striping connections to the interconnect contact pads. The address and sense lines are similarly arranged, and all of the diode circuit elements are automatically formed at the conductor cross-points (with certain diodes being later blown in programming as described above). It should be recognized that the drawings depicting the memory module layer are not to scale, and although the addressing sensing and striping circuitry is enlarged in the figures such circuitry would typically comprise only about 5-10% of the layer area.

Figure 15:
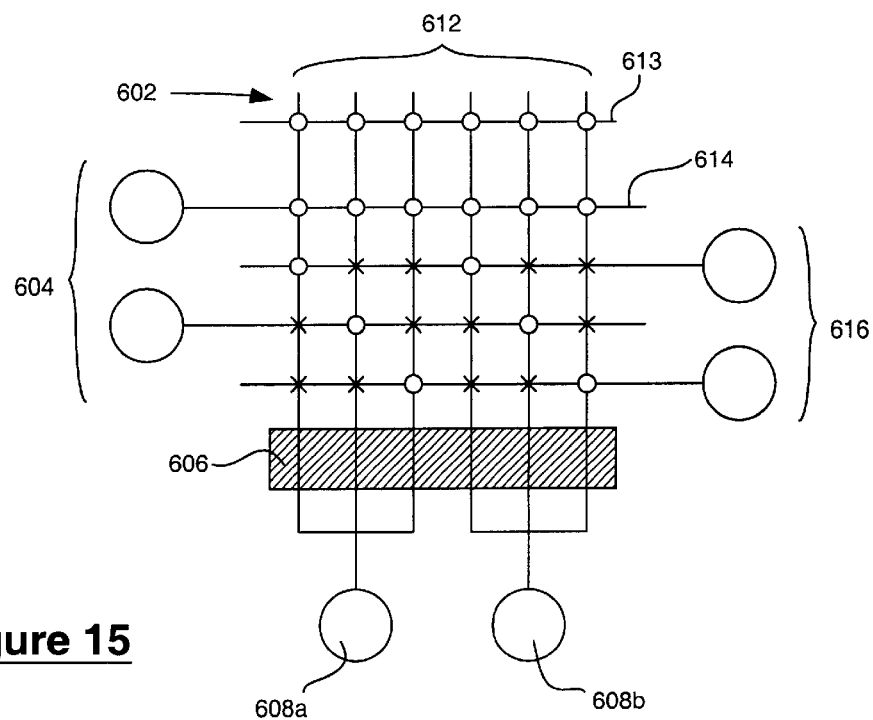
FIG. 15 is a diagrammatic layout view of a portion of memory array and addressing/sensing circuitry.

A portion of the memory module layer layout is shown in greater detail in FIG. 15. Here, a portion of a memory array 602 is shown with column electrodes 612 and row electrode 613. The column electrodes are crossed by a column sense line 614 and column address lines 616, forming the address/sense circuits 604. Pull-up/pull-down resistors are formed in the column electrodes at 606. The column electrodes are arranged into stripes, wherein groups of electrodes are coupled to separate power supply terminals 608a, 608b. The row electrodes (not shown) are similarly arranged. The power supply striping connections can be used as part of the addressing scheme as well as a mechanism to reduce leakage currents, by applying power to, and thereby selecting, only one portion (sub-array) of the memory array at a time.

Assuming that the address and power supply lines are bussed (common) to all of the layers in a memory module, writing data can be performed by addressing a bit on each layer and strobing the power supply in the active sub-array (determined by the power supply striping) from a read level to a write level. However, it must be possible to write different data states to different layers, and this can be achieved using the sense lines to pull down the voltage on layers where the memory element diode/fuse is to be protected. This means that the sense diodes must withstand a current that would blow the memory array elements. Accordingly, the sense diodes are fabricated with enlarged cross-sectional areas so as to reduce current density therethrough.

Another possible usage of redundant sense lines is to check the function of the memory before it is written. Information maybe gathered from inconsistent measurements from various sense lines in combination with various states of the power supply connections to the row and column electrode ends to reveal defective memory elements and/or defective addressing. This information maybe used to generate sparing tables that can be used to avoid writing to defective areas of the memory module and thereby improve the product tolerance to processing yields Memory Module Layer Structure Referring again to FIGS. 3, 4, 5 and 6, the physical structure of the memory module 20 of the preferred embodiment will be described. As mentioned, the preferred form of the memory module 20 has a plurality of stacked layers 22, each having a memory array formed on a plastic (polymer) substrate 50. Although it is not essential that a polymer material be used as a substrate, this is preferred because the materials can be produced and processed at relatively low cost. The substrate 50 may be formed from a variety of commercially available polymer materials, preferably in the form of a sheet material. A non-limiting list of exemplary polymer materials that may be used as a substrate 50 includes: polyimides, such as Kapton™ available from DuPont; polyethersulphone (PES); polyacrylate (PAR); polyetherimide (PEI), such as Ultem™ film available from General Electric; polyethylene napthalate (PEN); polyethylene terephthalate (PET); polyester terephthalate, such as Mylar™ available from DuPont; polytetrafluoroethylene (PTFE), such as Teflon™ available from DuPont; polycarbonate, such as Lexan™ available from General Electric; polyvinyl chloride (PVC); polyester films such as Melinex™ available from Orica; and other such polyester films and polymer films known for use in the art of forming circuits on plastic substrates. The substrate is preferably thin to permit flexible "roll-to-roll" processing, such as of the order of 0.01 mm to 0.05 mm in thickness.

The memory array 25 and mux/demux circuitry 30 can be formed according to a metal-semiconductor-metal (MSM) process on the plastic substrate 50. The MSM process results in two patterned layers of conductive metal circuits with one or more layers of semiconductor material (possibly incorporating metal and/or dielectric) therebetween. Where the metal layers cross and make contact to opposed sides of the semiconductor layer, a diode junction is formed between the metal layers. The production of MSM diode integrated circuits is described, for example, in the specification of International Patent Application Publication Number WO 99/39394, entitled "X-Y Addressable Electric Microswitch Arrays and Sensor Matrices Employing Them". The disclosure of that document is explicitly incorporated herein by reference.

There are many different materials that may be used for the semiconductor layer of the memory module circuits, some of which are disclosed in the aforementioned publication. Organic and inorganic materials may be used for the semiconductor layer. Inorganic materials include amorphous silicon and germanium materials, for example, and the use of such materials in similar applications is known in the field of photovoltaic cells. Inorganic semiconductor materials may be preferred, however, because of their ability to be processed at lower temperatures that are more compatible with formation on a plastic substrate. For example, a polyimide substrate material may be able to withstand processing at temperatures up to about 300 degrees Centigrade, however other possible substrate materials such as PEN and PET are limited to maximum processing temperatures of about 130–150 degrees C. Thus, the choice of semiconductor material for a given application may depend upon the selected substrate material. In general, a semiconductor material that can be processed (e.g. deposited and patterned, if necessary) at a temperature of less than about 150 degrees C will be compatible with most suitable substrates.

Examples of organic materials that may be employed as semiconductor layers in the memory module include a bi-layer consisting of copper pthalocyanine (CuPc) with PTBCI (3,4,9,10-perylenetetracarbonxilic-bis-benzimidazole). Other candidate materials that may be used in conjunction with CuPc are: PTCDA (3,4,9,10-perylenetetracarboxilic danhydride); and BTQBT [(1,2,5-thiadiazolo)-p-quinobis(1,3-dithiole)]. Layers can also be made from: TPD (N,N'-diphenyl-N,N'-bis(3-methylphenyl) 1-1'biphenyl-4,4'-diamine); α-NPD (4,4'-bis[N-(1-napthyl)-N-phenyl-amino]biphenyl); and TPP (5,10,15,20-tetraphenyl-21H,23H-porphine). Other materials may also be employed for the purposes of the present invention, as will be apparent to those skilled in the art.

Figure 16:
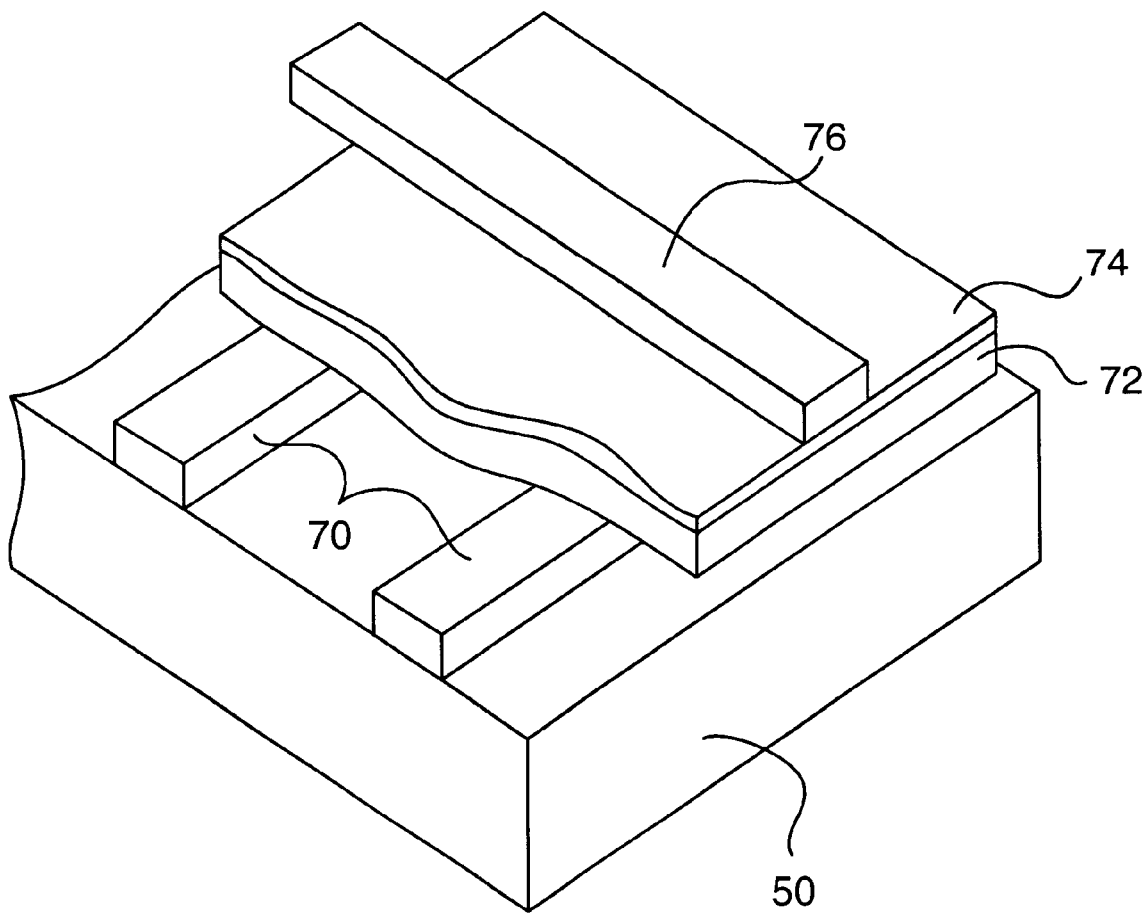
FIG. 16 is a cut-away isometric view of a memory module layer structure for use in an embodiment of the invention.

FIG. 16 is a simplified isometric diagram of a portion of a memory module circuit illustrating the general structure thereof. A pair of electrode conductors 70 are shown formed on the substrate 50 from a first metal layer. Two layers of semiconductor material 72, 74 are formed on the first metal layer. A conductor 76 extending transversely of the conductors 70 is formed from a second metal layer that overlays the semiconductor layers 72, 74. Where the semiconductor material is sandwiched between the conductors 70 and 76 of the first and second metal layers, diode elements are formed. In FIG. 16 the semiconductor layer as illustrated is continuous, however if the semiconductor material used has a low bulk resistivity relative to the thickness of the films such that the lateral leakage currents can be appreciable relative to the intended current through the films at the intersection of the electrodes, patterning of the semiconductor layer may be required.

Preferably diodes formed by the semiconductor layer(s) in the memory array act as both the diode (e.g. 66 in FIG. 7) and the fuse (64) of the memory elements. In this case the semiconductor layer(s) must perform the function of a fuse in that, under predetermined conditions, the diode junction characteristics change irrevocably to a high impedance state. For example, during a memory write operation a current density through the diode which is above a certain current density threshold may be used to break down the diode and alter the conduction characteristic thereof to a high impedance. An example of an electrode/semiconductor/electrode layered structure that can function in this way is:
(2000 Å)Au/(800 Å)CuPc/(800 Å)PTCB/(200 Å)BCP/(3600 Å)Ag
where CuPc is copper pthalocyanine, PTCB is 3,4,9,10-perylenetetracarbonxilic-bis-benimidazole, and BPC is bathocuproine.

Alternatively, the memory array may be constructed to operate in the opposite manner with "anti-fuse" elements, wherein the memory elements are fabricated in a high impedance state and can be written to to induce a low impedance condition. For example, a doped (e.g. $p^+$-n-i or $n^+$-p-i) amorphous silicon layer structure can be employed as the semiconductor layer, which may allow memory elements to in fact be erased or re-written if desired. Such structures are described, for example, in P.G. Lecomber, et al., "The Switching Mechanism in Amorphous Silicon Junctions",(Journal of Non-Crystalline Solids 77 & 78 (1985) pp1373-1382), and U.S. Pat. No. 4,684,972 entitled "Non-volatile Amorphous Semiconductor Memory Device Utilizing a Forming Voltage".The disclosures of those documents are hereby expressly incorporated herein by reference.

In addition to the memory array 25 and mux circuits 30, each memory module layer 22 also includes I/O lines 40 which extend from the mux circuits to adjacent edges of the substrate 50. The I/O lines are conductors that can be formed in the same metal layers used for the circuits 25, 30. The I/O lines 40 are connected to the addressing nodes and sense lines, for example, to enable signals to be applied to the I/O lines to address the memory array and read and/or write data. In the assembled memory module 20, where a plurality of layers are stacked on top of one another, selected ones of the I/O lines of the various layers may be coupled together. For example the respective I/O lines for addressing the memory array on the layers may be coupled in common amongst the layers to enable parallel addressing of the memory arrays. The sense lines for each layer should be separately accessible from the external to the memory module, however, so that the data in each array can be read or written in parallel.

Connections between the I/O lines of the memory module layers are, in the preferred embodiment, made at the edges of the layers forming the sides of the memory module block formation. This is achieved by exposing end portions of the I/O lines at edges of the layers and applying interconnecting conductors making contact thereto. This process is carried out in the assembly of the layers into the memory module, which is described in greater detail hereinbelow.

Layer Fabrication Process

Each layer of the memory module is advantageously constructed using a fast and inexpensive process to aid in achieving a low cost product. The use of a thin web substrate of flexible polymeric or metal (with dielectric film) material enables a relatively inexpensive roll-to-roll fabrication process to be employed, for example.

A web-processing technique referred to as emboss and lift-off described hereinbelow was originally developed for manufacturing a unique silver halide based photographic film at Polaroid™. The technology can be advantageously applied to producing the row and column electrodes for the cross-point memory array and address/sense lines since it has the ability to produce sub-micron sized features on plastic webs in an economical roll-to-roll process. An example of a micro-embossing process is described in U.S. Pat. No. 6,007,888 entitled "Directed Energy Assisted in Vacuo Micro Embossing", the disclosure of which is incorporated herein by reference. Alternatively, a conventional lithographic process may be used although currently the minimum feature size capability of such a process is limited to about 25 microns in a production environment.

Figure 17:
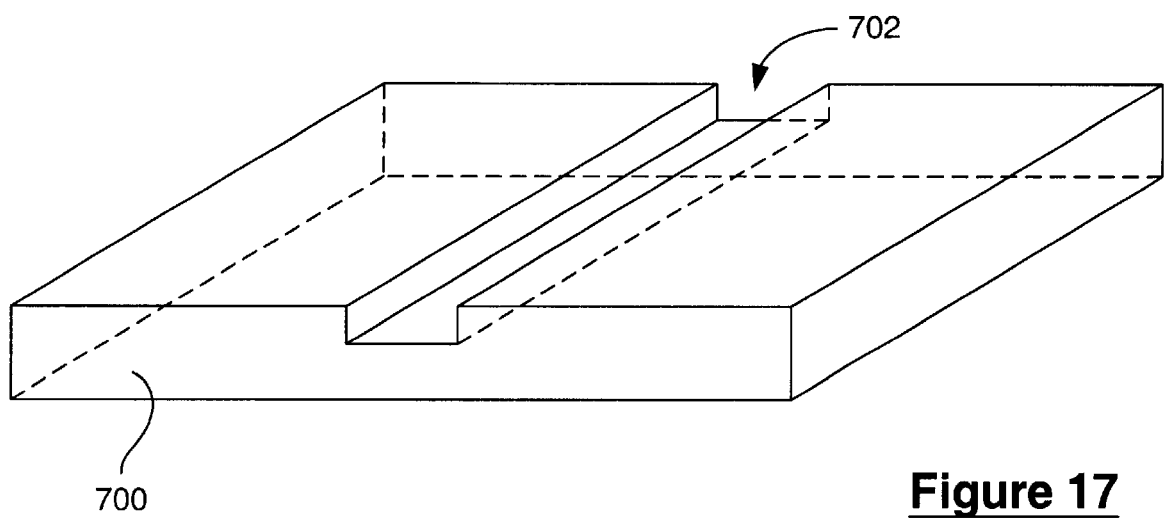
FIGS. 17 to 23 illustrate stages in an exemplary emboss/lift-off layer fabrication process.

The emboss lift/off process is illustrated in steps in FIGS. 17 to 23 which are referred to hereinbelow. The process begins with a plastic web 700 (FIG. 17) having a thickness as little as 10 microns. The first step in the process is to emboss this substrate with a pattern of micron scale features. The embossing is performed by a roll which has had features defined on its surface through a conventional high resolution lithographic process similar to that used to generate masters for the CD-ROM injection molding process. FIG. 17 shows a portion of the plastic substrate 700 after it has been embossed, illustrating an embossed feature groove 702. The pattern embossed onto the substrate corresponds, for example, to one conductor layer of a memory array and address/sense line circuit.

Figure 18:
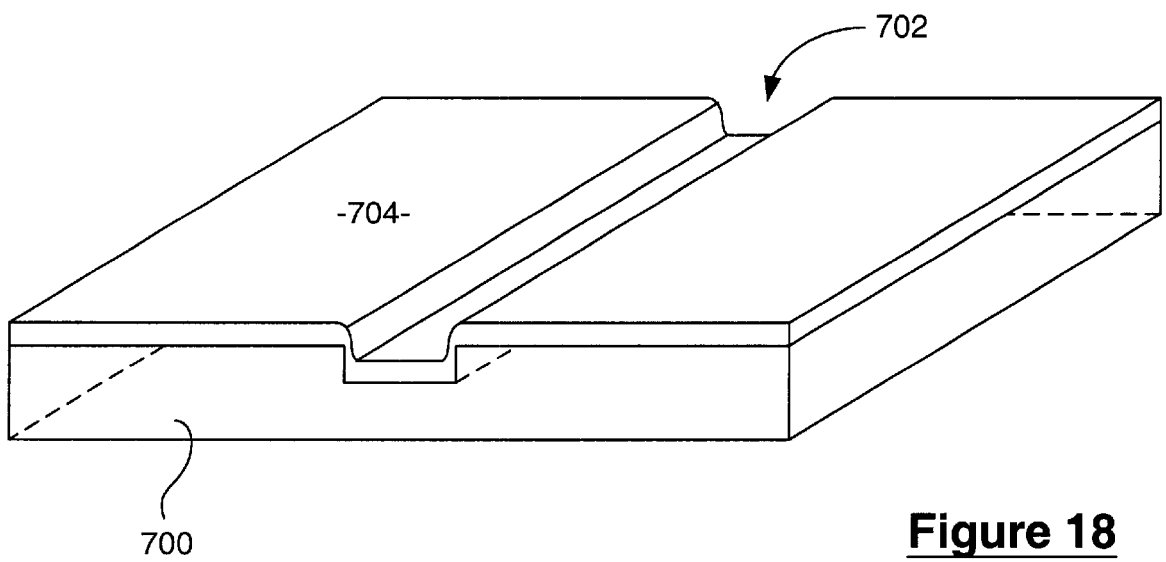

The web 700 is coated with a conductor (e.g. metal) material 704 using evaporation, sputtering, vapor deposition or the like. The coating may comprise a single thin film or several films forming a stack. The total deposited film thickness is less than the depth of the embossed features (702). FIG. 18 shows the web 700 after deposition with the conductor coating 704 covering the surface thereof into the embossed features 702. The nature of the deposition process results in non-uniform coating of the plastic, wherein the side walls of the embossed features have a thinner coating than the surfaces parallel to the face of the web. This is important for the lift-off step which follows.

In the lift-off step a second plastic film 706 coated with a pressure sensitive adhesive (not shown) is brought into contact with the coated surface of the first web 700. The second film sticks to the coating 704 at all points except for where the coating is recessed in the embossed features 702.

Figure 19:
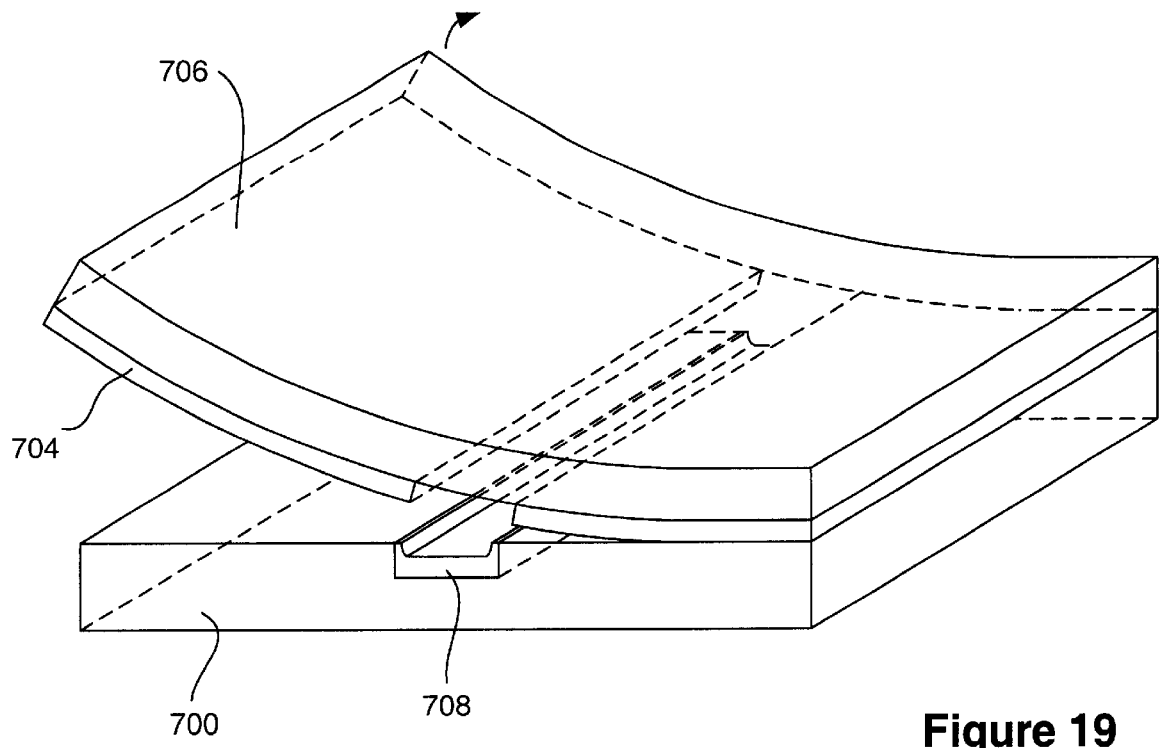

The second film is then stripped off, as illustrated in FIG. 19, removing the coating 704 from the first substrate except for portions 708 thereof recessed in the embossed regions. This process relies on two factors. The first factor is that the pressure sensitive adhesive forms a stronger bond to the coating 704 than the coating forms with the surface of film 700 on which it is deposited. The second factor is the requirement that the conductor material coating is thin enough on the side-walls of the embossed features so that these regions fracture instead of pulling the coating portions 708 out from the embossed recesses 702.

Figure 20:
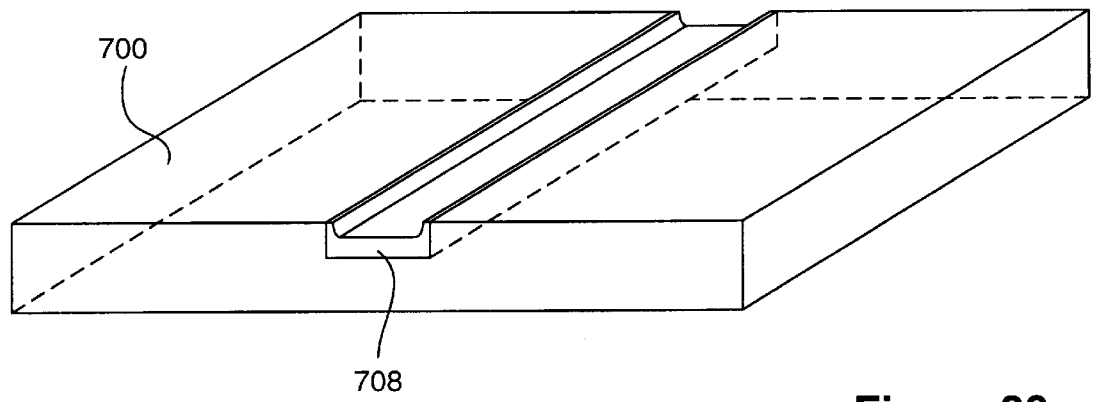
Figure 21:
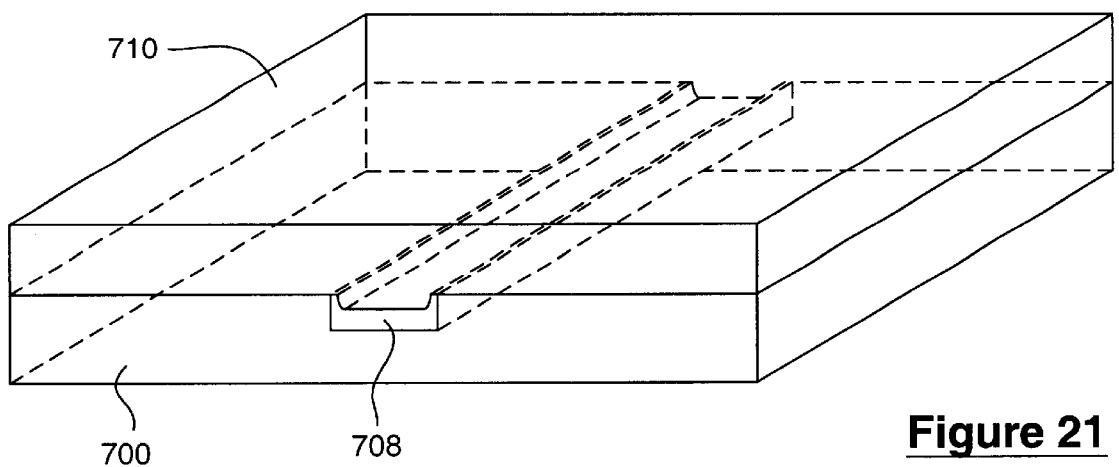
Figure 22:
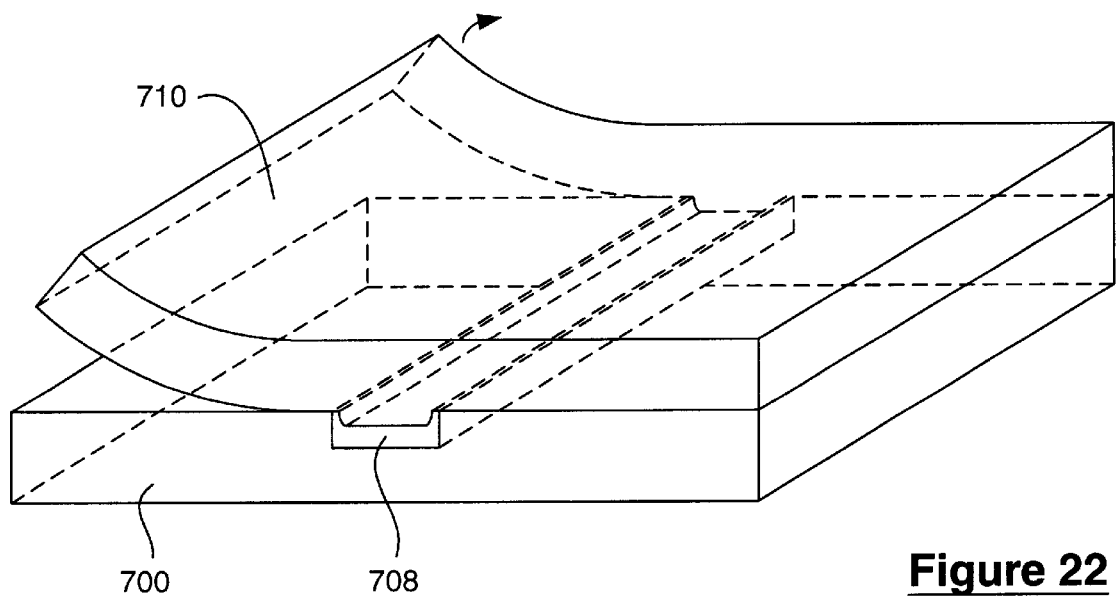
Figure 23:
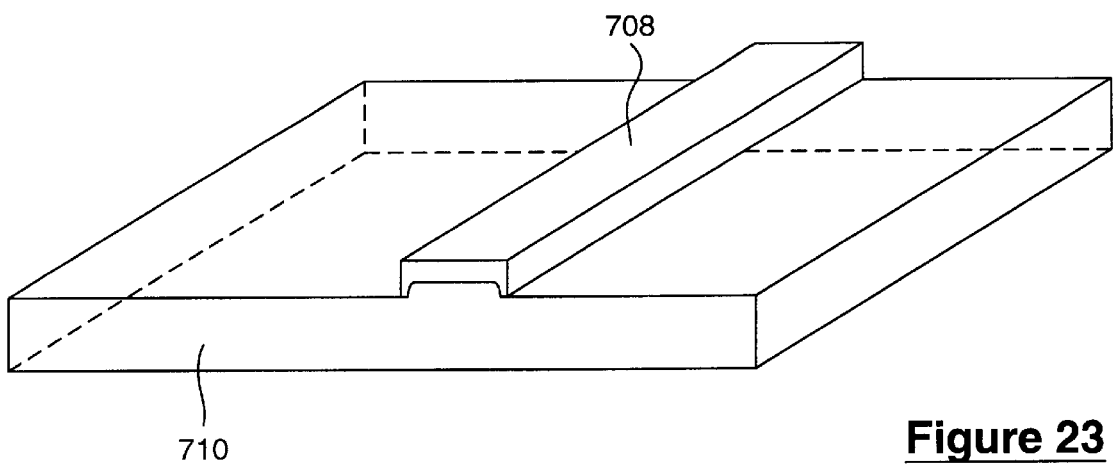

At this point there exist two usable patterned conductive films attached to plastic substrates. FIG. 20 shows the patterned coating 708 which remains on the embossed substrate 700 after lift-off. If it is desired to have the patterned conductors 708 from the embossed features stand proud of the plastic substrate, an additional lift-off can be employed. The first step of this optional lift-off is the application of a conformal coating 710 of a plastic material to the surface of the embossed substrate 700. The result of this step is depicted in FIG. 21. In this step the secondary plastic material 710 flows into the patterned features and adheres to the exposed surfaces of the remaining patterned conductors 708. When the plastic layer 710 is stripped from the embossed substrate 700, as depicted in FIG. 22, it pulls the patterned conductors 708 with it. FIG. 23 shows the (inverted) secondary plastic substrate 710 having patterned conductors 708 standing proud of thereon.

The above described emboss/lift-off process can be used to create the two separate conductor layers for each memory module layer. The memory module layer (22) can then be completed by sandwiching a semiconductor layer between the two conductor layers. For example, an appropriate layer or layers of materials for providing the diode junction and fuse functions, as discussed above, may be laid over the conductor pattern on one substrate and then the conductor pattern on the other substrate brought into physical contact with the exposed surface of the semiconductor layer. Such a process is illustrated diagrammatically in FIGS. 24, 25 and 26.

Figure 24:
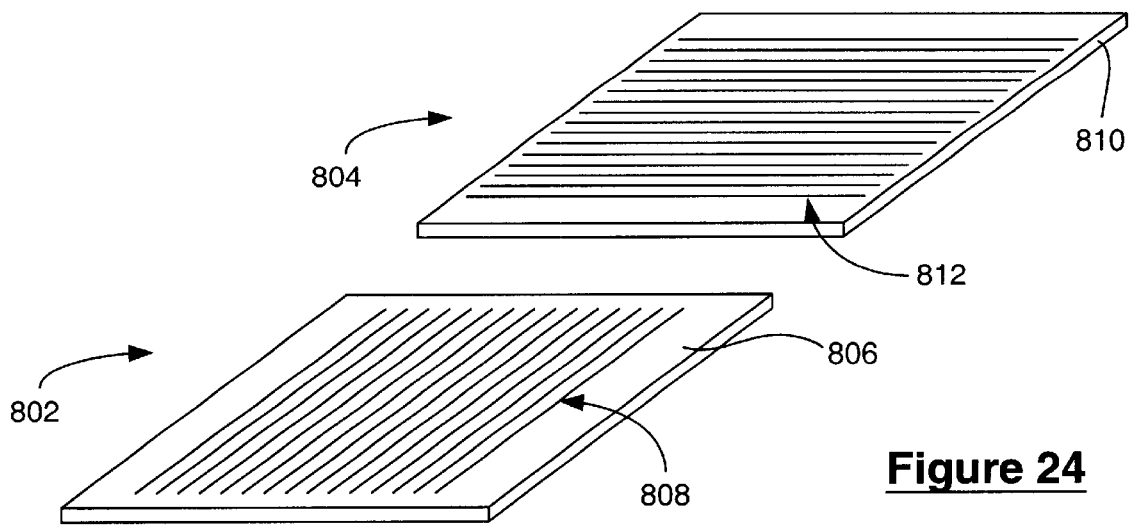
FIGS. 24 to 26 diagrammatically illustrate stages in a memory circuit sub-layer assembly process.

In FIG. 24, two sub-layers 802 and 804 are shown which may be separately created using the emboss/lift-off process. The sub-layer 802 comprises a first conductor arrangement 808 formed on substrate 806 which will form one of the conductor layers for a memory circuit. For example, the conductor arrangement 808 might comprise the column electrodes, the row address lines and row sense line(s), together with the contact pads and couplings associated therewith. The sub-layer 804 comprises a second conductor arrangement 812 formed on a substrate 810. The second conductor arrangement may comprise the row electrodes, column address lines, column sense line(s) and associated contacts and connections.

Figure 25:
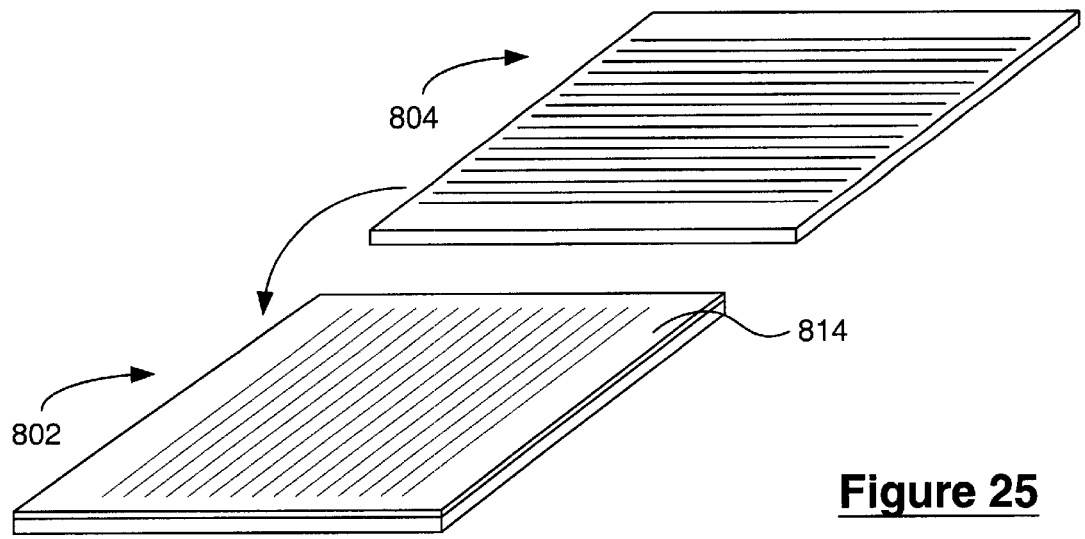
Figure 26:
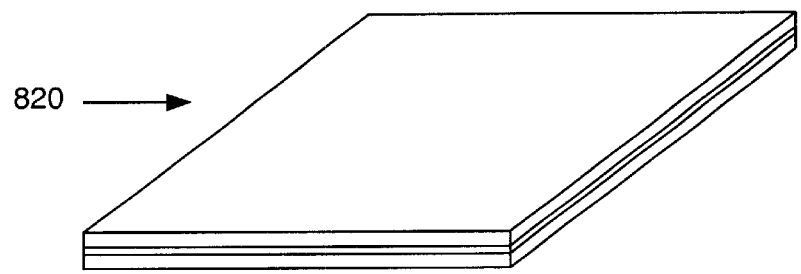

A semiconductor layer (814) or layers for forming diode junction and fuse functions is shown in FIG. 25 deposited over the first conductor arrangement on the substrate 806 of the first sub-layer 802. This forms electrical contact between the first conductor arrangement and one side of the semiconductor layer(s). The second sub-layer 804 is then placed inverted on top of the deposited semiconductor layer(s) so that the second conductor pattern makes contact with the other side of the semiconductor layer(s). The electrode conductors of the first and second sub-layers are arranged transverse (e.g. orthogonal) to one another to form cross-point junctions as discussed above. Since the circuit structures are all formed from cross-point diodes and interconnections therebetween, close alignment tolerance between the first and second sub-layers is not necessary. This forms the completed memory module layer illustrated at 820 in FIG. 26. A plurality of such layers can then be assembled into a memory module as described hereinbelow.

Depending upon the actual choice of semiconductor layer material, the sub-layers may be bonded to one another with the semiconductor material acting as a form of adhesive. Small molecular weight semiconductor materials have been shown capable of bonding quite strongly to the contact sub-layers. Alternatively, where plastic substrate material is employed, the plastic sub-layer materials may be bonded together by heating.

As will be appreciated more fully from the memory module assembly description which follows, it is desirable for the contact pads (e.g. 42 in FIG. 5) to be relatively wide in lateral extent to allow for easier alignment of interconnects between layers in the memory module. However, in the emboss/lift-off procedure described above, there is a limit to the width of an embossed region that can be created without the lift-off film (706) adhering to the conductor layer (708) in the embossed area. Accordingly, it is preferred that the contact pads be formed from a series of crossed conductors (on a single conductor layer) to avoid such difficulties.

Memory Module Fabrication Process

Construction of the memory module 20 involves the stacking of multiple layers of memory into an interconnected three-dimensional storage module. Depending on the process used to fabricate the memory the stacking may be achieved by the deposition of multiple crossbar layers on a common substrate or it may be performed by laminating complete layers each fabricated on its own thin substrate (such as those described hereinabove). U.S. Pat. No. 5,640,760 assigned to Thomson-CSF addresses the latter method of construction. Stacking and interconnect technology is also available from Irvine Sensors Corporation of Costa Mesa, California, and aspects of the processes are described in U.S. Pat. Nos. 5,424,920, 5,701,233 and 5,953,588, for example. Stacking and interconnect technology is also available from 3D Plus of Buc, France.

Figure 27:
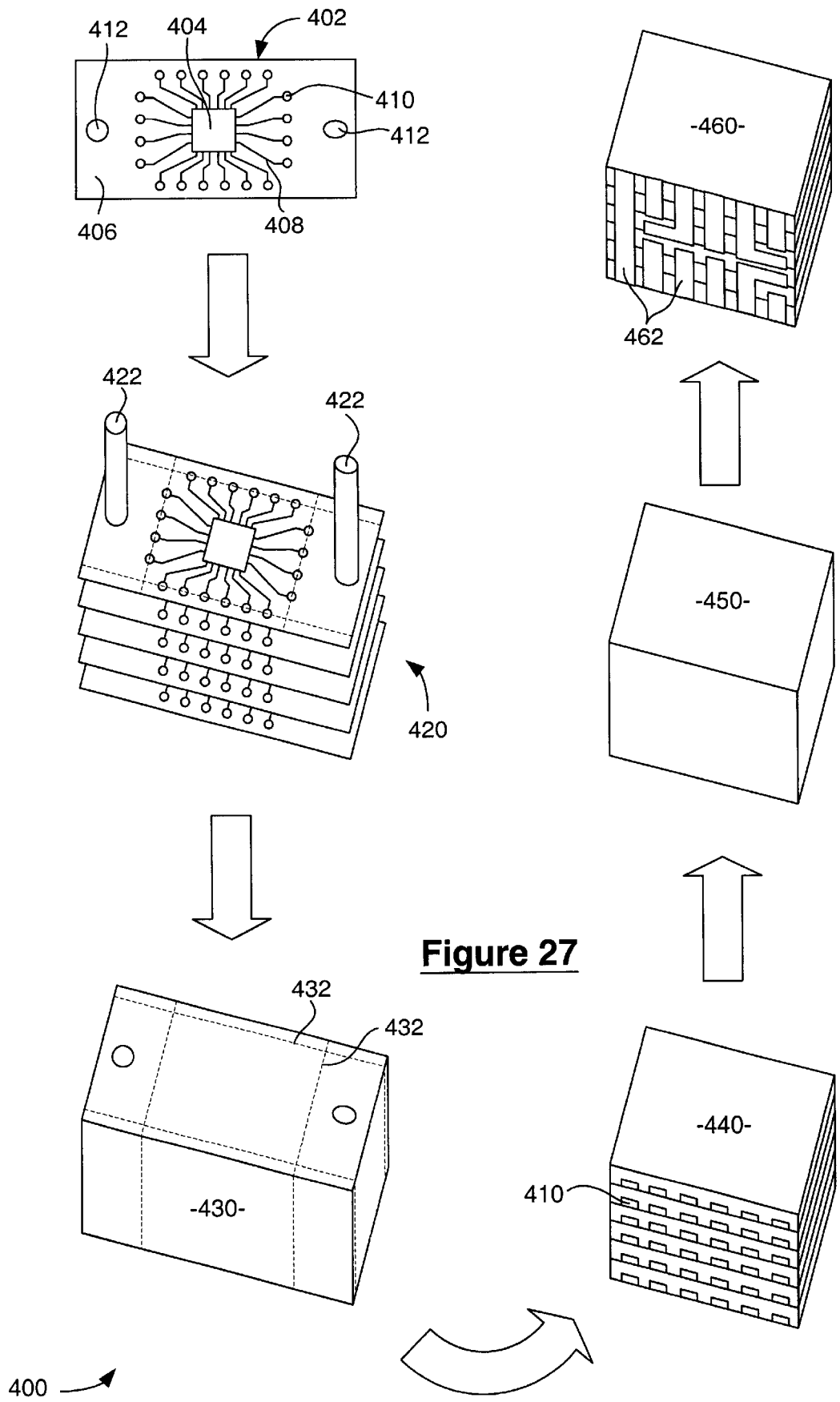
FIG. 27 is a diagrammatic illustration of a memory module fabrication process.

FIG. 27 illustrates the general steps of a process 400 for constructing a memory module 20 according to an embodiment of the invention from a plurality of layers 22 as above described. The process 400 begins with a fabricated integrated circuit layer 402, comprising memory array and addressing circuitry 404 formed on a plastic substrate 406. The layer 402 also has interconnect leads 408 extending from the input and output nodes of the circuitry 404 to respective linearly arranged contact pads 410. The layer 402 further includes alignment apertures 412 formed through the substrate 406. The layers 402 are preferably tested to ensure the circuitry thereon functions adequately before they are passed for assembly into a memory module.

At the next stage of the process 400, a plurality of layers 402 are aligned and stacked on top of one another, using alignment rods 422 extending through the alignment apertures 412, forming a stack of layers 420. The stack 420 can comprise a plurality of identical layers 402 all arranged in the same orientation. For example, up to about 50 layers may be used to form the stack 420. The layers of the stack are laminated together using an epoxy resin material or the like, which affixes the layers in their aligned arrangement and forms a sealed block 430.

Ends and sides are cut from the block 430 through the lines indicated at 432 in the Figure, using a high precision saw or other appropriate cutting instrument. As illustrated on the top layer of the stack 420 in the Figure, the planes through which the block 430 is cut extend through the lines of contact pads 410, thereby exposing end surfaces of the contact pads 410 from each layer in the laminated stack at the sides of the cut block. The block after the cutting procedure is shown at 440, with illustrating the exposed ends of the contact pads 410 from each of the layers. It will be recognized that the features in the simplified drawing are not shown to relative scale, and some features, such as the exposed contact pad portions, are exaggerated for the purposes of illustration.

The cut block 440 is plated with a conductive metal covering, such as a Nickel/Aluminum alloy, forming a plated block 450. The metal covering makes electrical connection to the ends of the contact pads 410 exposed at the sides of the cut block 440 prior to plating. Finally, portions of the metal coating are removed from the plated block 450, using a laser grooving process, for example. The remaining portions 462 of the metal plate provide desired interconnections between contact pads of the various layers in the block. The metal plating can be patterned in any desired manner, for example to provide common connection between the addressing inputs of the memory module layers and separate connections to the I/O sense lines or the like. A completed memory module 20 is illustrated at 460, wherein the exterior surfaces of the remaining metal plate portions 462 provide electrical contacts for interface with external circuitry, such as the interface and control circuitry 14 of FIG. 1.

In some applications the memory system of the preferred embodiment should allow transfer rates on the order of 20 Mb/s, however the readout of an individual bit may be relatively slow (~10 $\mu$s) due to remote detection and array capacitances. Since the memory module comprises a number of cross-point memory layers, data words can be built from bits from each layer, each of which has been addressed by the same parallel address lines. Another alternative is to subdivide individual cross-point layers and read more than one bit per layer. If the system requirements dictate that a large number of bits in parallel are read simultaneously in order to meet the transfer rate objective then the number of interconnects necessary between the memory module and the host card may be too numerous to allow for a reliable interface. In that case the memory module may be constructed with circuitry to perform some detection and serial to parallel to serial data conversion. If TFT technology is used in the process than this can be accomplished by constructing appropriate circuits in a straightforward manner. Otherwise an integrated circuit could be included in the memory module, although such an approach may be undesirable because of increased product cost.

General Considerations

The memory system described herein has several features that make it particularly suitable for portable appliances requiring data storage, such as digital cameras (still picture and/or video), digital music players/recorders (e.g. MP3 players), personal digital assistants (PDAs), mobile telephones, etc. The memory system is able to provide data storage in capacities sufficient to be useful such appliances and can be produced at relatively low cost. Data can be written to the memory and thereafter it is permanently stored. Thus, a high capacity storage device (e.g. 100 MB to over 1 GB) can be provided at low cost (e.g. less than about $5) for permanent archival data storage with use in portable appliances.

The data storage is provided by a memory module that is produced at low cost by using inexpensive materials and processing technology. The memory module is formed of a plurality of layers each having a cross-point memory array.

Many layers can be stacked to form a single memory module (although only up to 60 or so layers may fit within a Compact Flash card profile, for example), allowing the memory module to have a storage capacity of many multiples of the data storage possible on a single layer. Each layer is formed on an inexpensive flexible substrate, such as polymer or dielectric coated metal. This is much cheaper than a traditional single crystal silicon substrate, and allows for relatively fast and inexpensive fabrication processes to be used. The circuitry formed on each layer, comprising the cross-point memory array and associated addressing circuits, is designed to be simple in structure to enable uncomplicated fabrication processing. In particular, the memory array and addressing circuits are designed according to a permuted diode logic regime which allows both the memory array and addressing circuits to be fabricated using the same simple process.

Each memory module layer has two sets of electrode conductors arranged in respective layers with a semiconductor layer therebetween. The electrodes are arranged in an orthogonal matrix and at the intersection point of each pair of crossing electrodes a memory element is formed in the semiconductor material. The semiconductor layer allows for low temperature processing so as to be compatible with a plastic substrate, and may be an amorphous silicon material or constructed from one or more organic semiconductor materials. Where the electrode layers cross, separated by the semiconductor layer, a rectifying junction is formed between the two electrode conductors. Each rectifying junction can be considered as a diode in series with a fuse element, and such junctions form the basis of the memory array and the permuted diode logic addressing circuits.

The memory module layers are produced using simple and inexpensive processing. Through use of a flexible plastic or metal substrate, roll to roll processing is possible in fabrication of the circuits on the layers. Diode logic in the addressing circuits allow the same process to be used in fabricating the memory array and addressing circuits on a single substrate. Contact pads and conductors are also formed on the substrate for making external connection to the circuits. A plurality of the layers are stacked on top of one another and laminated together. The memory module is then completed by forming and pattering external contact tracks which make electrical contact with the contact pads at the edges of the memory module layers. These contact tracks couple the circuits on the respective layers together and provide connections to external circuitry.

The addressing circuitry included on each layer of the memory module facilitates a reduction in the number of externally accessible addressing lines that are required to read from or write to the memory elements in each layer. This allows a manageable number of the interconnections between the layers in the memory module and to external circuitry for a large storage capacity module. Power supply striping is also used, wherein power is supplied to only a portion of the memory array at a time. This can form part of the memory array addressing scheme and also reduces leakage currents in the array during data reading.

Interface and control circuitry is separate from the memory module, constructed for example in the form of a convention integrated circuit or circuits. The interface and control circuitry includes an addressing circuit for generating addressing signals to be applied to the memory module, and a sensing circuit for reading stored data. The sensing scheme is based on electrical current levels rather than electric charge, which allows the sensing circuitry to more easily read data remotely from the memory module. Furthermore, the data storage is based on a large resistance change when a memory element fuse is blown, which provides relatively large sensing signals.

As the data storage in the memory module is separate from the interface and control circuitry, the memory module can be replaced when it has reached storage capacity and another memory module can be used with the same interface and control circuitry. This means that most reusable components of the memory system do not have to be replaced when more data storage is required. Also, the interface and control circuitry can be relatively complex because it is not limited by the memory module fabrication process, and can be relatively expensive since it represents a one time cost in the memory system. This can be exploited by providing sophisticated error detection and correction capability in the interface and control circuitry which allows the memory system to be error tolerant despite remote sensing and able to cope with imperfectly fabricated memory modules thereby increasing the number of useable memory modules from an imperfect fabrication process yield.

Compared to Flash, the memory system of the preferred embodiment has the advantages of lower cost, greater volumetric density, and permanence. Such a memory system represents to digital photography what film is to conventional photography. The material and fabrication costs are low enough that the memory modules may be accepted as a consumable. The irreversible write process provides a permanent archive of photos, as the negative does for conventional photography. This is not the case with Flash memory, which requires the user to select a secondary archive medium and transfer the data to that medium. The large volumetric storage density that can be provided by the memory system of the preferred embodiment allows sufficient memory to be fit into compact form factors, and thereby enables new use models, such as video, for digital photography. Compared to the other storage modalities mentioned above (hard disc, removable optical disc, or tape) the present memory system and Flash memory share the same advantages of mechanical robustness, low power consumption, compactness, and rapid access.

The foregoing detailed description of a preferred embodiment of the present invention is presented by way of example only, and many variations to the circuits, structures, arrangements and processes described are possible without departing from the scope of the invention. For example, the memory system of the preferred embodiment is described primarily in the context of a removable memory module for use in an industry standard interface card, such as PCMCIA, Smart Media, SD, MMC or Compact Flash, or in a custom interface card. It will be readily recognized, however, that many other applicattions are possible. The memory structure of the invention can be embedded in an appliance, for example, providing one-time programmable (OTP) memory in a personal digital assistant (PDA) or the like. Thus, whilst the memory is described as being separate from controlling circuitry in order to reduce the cost of a removable memory module, in other applications a unified structure may be used. For example, controlling circuitry can be embedded in the appliance with the memory either embedded or removable. Alternatively, the controlling circuit can be incorporated into the memory module package, for example as an additional layer or layers in the module. This may be appropriate where very large (and relatively more expensive) memory modules are constructed where the controlling circuitry cost is a smaller proportion of the total module cost or potential sale price.

The structure of the memory module also has many possible variations whilst retaining the principles of the present invention. In the described embodiment a single memory array is fabricated on each layer, and the layers are aligned and stacked in top of one another. Each layer could alternatively include more than one memory array, and the layers could also be stacked in a different way, such as a fan-fold stack. It may also be advantageous in some applications to fabricate multiple circuit layers built up on a single substrate.

The principles of the present invention can be applied with many other variations to the circuits, structures, arrangements and processes described herein, as will be apparent to those of ordinary skill in the art, without departing from the scope of the invention as defined in the appended claims.

We claim:

1. A data storage device, comprising a cross-point memory array formed on a dielectric substrate material, the cross-point memory array comprising first and second sets of transverse electrodes separated by a storage layer including at least one semiconductor layer, the storage layer forming a non-volatile memory element at each crossing point of electrodes from the first and second sets, each memory element being switchable between low and high impedance states, representing respective binary data states, by application of a write signal in the form of a predetermined current density through the memory element, each memory element including a diode junction and a fuse or an anti-fuse formed in said storage layer.

2. A data storage device as claimed in claim 1, wherein the dielectric substrate is a polymeric material.

3. A data storage device as claimed in claim 2, wherein the storage layer is formed from material capable of processing at temperature lower than the processing temperature of the polymeric substrate material.

4. A data storage device as claimed in claim 2, wherein the dielectric substrate is a material selected from: polyimide; polyethersulphone (PES); polyacrylate (PAR); polyetherimide (PEI); polyethylene napthalate (PEN); polyethylene terephthalate (PET); polyester terephthalate; polytetrafluoroethylene (PTFE); polycarbonate; and polyvinyl chloride (PVC).

5. A data storage device as claimed in claim 1, wherein the substrate comprises a metal film having a coating of dielectric material thereon.

6. A data storage device as claimed in claim 1, wherein the at least one semiconductor layer of the storage layer is formed from an organic semiconductor material.

7. A data storage device as claimed in claim 6, wherein the organic semiconductor material is selected from: copper pthalocyanine (CuPc); PTBCI (3,4,9,10-perylenetetracarbonxilic-bis-benzimidazole); PTCDA (3,4, 9,10-perylenetetracarboxilic danhydride); BTQBT [(1,2,5-thiadiazolo)-p-quinobis(1,3-dithiole)]; TPD (N,N'-diphenyl-N,N'-bis(3-methylphenyl) 1-1'biphenyl-4,4'-diamine); α-NPD (4,4'-bis[N-(1-napthyl)-N-phenyl-amino]biphenyl); and TPP (5,10,15,20-tetraphenyl-21H,23H-porphine).

8. A data storage device as claimed in claim 1, wherein the at least one semiconductor layer of the storage layer is formed from an amorphous inorganic semiconductor material.

9. A data storage device as claimed in claim 1, further comprising address decoding circuitry coupled to said first and second sets of memory array electrodes, the address decoding circuitry having first and second sets of input lines for addressing the first and second sets of electrodes, respectively.

10. A data storage device as claimed in claim 9, wherein the first and second sets of input lines are coupled through diode elements to selected ones of the first and second sets of memory array electrodes, respectively.

11. A data storage device as claimed in claim 10, further including at least one data sense line having diode connections to each of the first and/or second set memory array electrodes.

12. A memory module comprising a plurality of modules layers each having a data storage device as claimed in claim 11.

13. A data storage device as claimed in claim 10, wherein the first and second sets of memory array electrodes are formed in separate layers separated by said storage layer, and wherein the first and second sets of input lines are formed in the same layers as the second and first sets of electrodes, respectively.

14. A data storage device as claimed in claim 13, wherein the first and second sets of input lines are arranged to cross the first and second sets of memory array electrodes, respectively, separated by said storage layer, and wherein the selected diode connections between respective input lines and electrodes are formed by said storage layer at the crossing points thereof.

15. A data storage device as claimed in claim 9, further comprising power supply striping circuitry coupled to said first and second sets of memory array electrodes.

16. A data storage device as claimed in claim 15, wherein the power supply striping circuitry comprises ends of electrodes coupled through respective resistive elements and coupled together in groups to selective power supply stripe lines.

17. A data storage device as claimed in claim 16, further including at least one data sense line having diode connections to each of the first and/or second set memory array electrodes.

18. A memory module comprising a plurality of modules layers each having a data storage device as claimed in claim 17.

19. A memory module as claimed in claim 18, wherein the module layers are laminated together to form a block, and electrical contacts are provided on at least one external surface of the block for providing interconnection with the first and second sets of input lines, the at least one sense line and the power supply stripe lines of each module layer.

20. A memory module as claimed in claim 19, wherein corresponding input lines from each of the plurality of module layers are connected in parallel to address contacts for parallel addressing of the memory arrays in the memory module.

21. A memory module comprising a plurality of module layers each having a data storage device as defined in claim 1.

22. A memory module comprising a plurality of memory circuits formed in a unitary package, each memory circuit comprising a non-volatile cross-point memory array and an address decoding circuit fabricated on a common non-semiconductor substrate, wherein each memory circuit is formed from first and second layers of traverse conductor tracks separated by a storage layer including at least one non-semiconductor substrate layer.

23. A memory module as claimed in claim 22, wherein the memory array of each memory circuit comprises a matrix of memory elements, each memory elements being formed by overlying portions of conductor tracks from the first and second layers at a crossing point thereof and a portion of said storage layer therebetween.

24. A memory module as claimed in claim 24, wherein each memory element is switchable between low and high impedance states, representing respective binary data states, by application of a write signal in the form of a predetermined current density through the memory element, each memory element including a diode junction and a fuse or an anti-fuse formed in said storage layer.

25. A memory module as claimed in claim 24, wherein the address decoding circuit of each memory circuit comprises selected diode interconnections made through said storage layer between overlying portions of conductor tracks from the first and second layers at crossing points thereof.

26. A memory module as claimed in claim 25, wherein the memory module is constructed from a plurality of module layers, each module layer having at least one of said plurality of memory circuits.

27. A memory module as claimed in claim 26, wherein the module layers are laminated together to form a block, and electrical contacts are provided on at least one external surface of the block for providing interconnection with conductor tracks of the memory circuits.

28. A memory module as claimed in claim 27, wherein inputs to the address decoding circuits of a plurality of the module layers are coupled together in parallel to the external electrical contacts.

29. A memory system comprising:

a memory module as claimed in claim 27; and an interface card adapted for interconnection with a data processing appliance, the interface card including control circuitry for addressing, writing to and reading from the memory module, and a memory module interface adapted to receive a said memory module and interconnect said control circuitry and said memory circuits through said external electrical contacts.

30. A digital data memory system comprising:

a memory module having a plurality of non-volatile cross point memory arrays for permanently storing write-once data, each cross point memory array being formed on a non-semiconductor substrate, and the non-semiconductor substrates form the unitary package; and an interface card adapted for interconnection with a data processing appliance, the interface card including control circuitry for addressing, writing to, and reading from the memory module, and a memory module interface adapted to receive said memory module and interconnection said control circuitry and said memory arrays.

* * * * *